(12) United States Patent
Satou

(10) Patent No.: US 9,877,576 B2
(45) Date of Patent: Jan. 30, 2018

(54) TABLE DEVICE AND CONVEYANCE DEVICE

(71) Applicant: NSK LTD., Tokyo (JP)

(72) Inventor: Toshinori Satou, Kanagawa (JP)

(73) Assignee: NSK LTD., Tokyo (JP)

( * ) Notice: Subject to any disclaimer, the term of this patent is extended or adjusted under 35 U.S.C. 154(b) by 105 days.

(21) Appl. No.: 14/901,377

(22) PCT Filed: Dec. 18, 2013

(86) PCT No.: PCT/JP2013/083978
§ 371 (c)(1),
(2) Date: Dec. 28, 2015

(87) PCT Pub. No.: WO2015/001690
PCT Pub. Date: Jan. 8, 2015

(65) Prior Publication Data
US 2016/0135587 A1    May 19, 2016

(30) Foreign Application Priority Data

Jul. 2, 2013  (JP) .................................. 2013-138729

(51) Int. Cl.
*A47B 9/10* (2006.01)
*A47B 13/08* (2006.01)
(Continued)

(52) U.S. Cl.
CPC .............. *A47B 13/081* (2013.01); *A47B 9/00* (2013.01); *A47B 9/10* (2013.01); *B23Q 1/64* (2013.01);
(Continued)

(58) Field of Classification Search
CPC ...... F16C 29/06; F16C 32/06; F16C 32/0614; F16C 29/007; F16C 32/0662;
(Continued)

(56) References Cited

U.S. PATENT DOCUMENTS 3,389,625 A * 6/1968 Wagner .................. B23Q 1/262
384/44
4,479,681 A * 10/1984 Suzuki .................. F16C 29/002
384/13
(Continued)

FOREIGN PATENT DOCUMENTS

JP    2001-235001 A    8/2001
JP    2004-47852 A     2/2004
(Continued)

OTHER PUBLICATIONS

JPO Office Action for Application No. 2013-138729 dated Mar. 13, 2014.
(Continued)

*Primary Examiner* — Marcus Charles
(74) *Attorney, Agent, or Firm* — Sughrue Mion, PLLC

(57) ABSTRACT

A table device including a first member; a second member; a first guide device guiding the second member such that the second member is moved in a direction parallel to a first axis by movement of the first member; a table supported by the second member; a third member connected to at least a part of the table; a bearing member forming a gas bearing between the bearing member and the third member with a gas supplied between the bearing member and the third member, and movably supporting the third member in the direction parallel to the first axis; and a support device including a parallel pin that is arranged such that the parallel pin becomes parallel to the first axis, and connects the second member and the table, and supporting the table. The table is supported by the second member through the support device.

10 Claims, 12 Drawing Sheets

(51) Int. Cl.

| | | |
|---|---|---|
| *F16C 29/06* | (2006.01) | |
| *F16C 32/06* | (2006.01) | |
| *F16C 29/00* | (2006.01) | |
| *F16C 29/02* | (2006.01) | |
| *B23Q 1/64* | (2006.01) | |
| *G03F 7/20* | (2006.01) | |
| *A47B 9/00* | (2006.01) | |
| *G12B 5/00* | (2006.01) | |

(52) U.S. Cl.
CPC ............ *F16C 29/025* (2013.01); *F16C 29/06* (2013.01); *F16C 32/06* (2013.01); *F16C 32/0614* (2013.01); *G03F 7/70716* (2013.01); *G03F 7/70816* (2013.01); *F16C 2322/39* (2013.01); *G12B 5/00* (2013.01)

(58) Field of Classification Search
CPC .............. F16C 2322/39; F16C 2322/58; F16C 29/025; F16C 32/0607; A47B 13/081; A47B 9/00; G03F 7/70716; G03G 7/70816; G12B 5/00; B23Q 1/40; B23Q 1/65; B23Q 1/62; B23Q 1/64
USPC ............... 384/9, 109, 36, 43–44, 49–50, 57; 74/409.07, 490.09; 310/569–570, 581, 310/561, 662, 669
See application file for complete search history.

(56) References Cited

U.S. PATENT DOCUMENTS

| | | | | |
|---|---|---|---|---|
| 4,838,515 A | * | 6/1989 | Prentice | B23Q 1/48 248/419 |
| 5,341,751 A | * | 8/1994 | Cuneo | B23Q 1/01 108/143 |
| 5,731,641 A | * | 3/1998 | Botos | G03F 7/70716 108/138 |
| 6,186,024 B1 | * | 2/2001 | Leiber | B23Q 1/56 108/143 |
| 6,486,574 B2 | * | 11/2002 | Botos | G05D 3/12 108/138 |
| 7,234,675 B2 | * | 6/2007 | Ueno | B23Q 1/58 248/657 |
| 7,910,857 B2 | * | 3/2011 | Gattiglio | B23K 26/08 219/121.78 |
| 8,117,694 B2 | * | 2/2012 | Farooqui | A61B 6/0457 198/468.9 |
| 8,251,587 B2 | * | 8/2012 | Michioka | F16C 29/002 384/36 |
| 8,683,889 B2 | * | 4/2014 | Wang | F16H 25/183 74/490.09 |
| 2004/0129856 A1 | | 7/2004 | Ueno | |
| 2008/0013060 A1 | | 1/2008 | Ichinose et al. | |

FOREIGN PATENT DOCUMENTS

| | | | | |
|---|---|---|---|---|
| JP | 2004-195620 A | | 7/2004 | |
| JP | 2004-291156 A | | 10/2004 | |
| JP | 4160824 B2 | * | 10/2008 | .............. B23Q 1/58 |
| JP | 2009-12168 A | | 1/2009 | |
| JP | 2009-218389 A | | 9/2009 | |
| JP | 2010-153644 A | | 7/2010 | |
| JP | 2011-60823 A | | 3/2011 | |
| WO | WO-0003149 A1 | * | 1/2000 | ............ F16C 29/005 |
| WO | 2006/009254 A1 | | 1/2006 | |
| WO | 2011/138938 A1 | | 11/2011 | |

OTHER PUBLICATIONS

International Search Report for PCT/JP2013/083978 dated Mar. 25, 2014 [PCT/ISA/210].
Written Opinion for PCT/JP2013/083978 dated Mar. 25, 2014 [PCT/ISA/237].

* cited by examiner

TABLE DEVICE AND CONVEYANCE DEVICE

CROSS REFERENCE TO RELATED APPLICATIONS

This application is a National Stage of PCT international application No. PCT/JP2013/083978 filed on Dec. 18, 2013 which designates the United States, incorporated herein by reference, and which is based upon and claims the benefit of priority from Japanese Patent Application No. 2013-138729 filed on Jul. 2, 2013, the entire contents of which are incorporated herein by reference

FIELD

The present invention relates to a table device and a conveyance device.

BACKGROUND

In conveyance devices, table devices provided with a movable table, such as one disclosed in Patent Literature 1, are used.

CITATION LIST

Patent Literature

Patent Literature 1: Japanese Laid-open Patent Publication No. 2004-195620

SUMMARY

Technical Problem

In a table device, when a table deviates from a target trajectory although the table is intended to be moved in the target trajectory, performance of a conveyance device provided with the table device may be decreased. For example, when the table is not moved straight although the table is intended to be moved straight in a vertical direction, the positioning accuracy of the table is decreased, and an object placed on the table may not be arranged in a desired position.

An objective of the present invention is to provide a table device and a conveyance device that can suppress deviation of the table from the target trajectory and a decrease in positioning accuracy.

Solution to Problem

A table device according to an aspect of the present invention for achieving the above objective includes: a first member movable in a predetermined plane; a second member relatively movable to the first member; a first guide device, at least a part of the first guide member being arranged in the first member, and the first guide device guiding the second member such that the second member is moved in a direction parallel to a first axis perpendicular to the predetermined plane by movement of the first member; a table supported by the second member; a third member connected to at least a part of the table; a bearing member forming a gas bearing between the bearing member and the third member with a gas supplied between the bearing member and the third member, and movably supporting the third member in the direction parallel to the first axis; and a support device including a parallel pin that is arranged such that the parallel pin becomes parallel to the first axis, and connects the second member and the table, and supporting the table. The table is supported by the second member through the support device.

Therefore, the table to which the third member is connected is movable in a target trajectory by the gas bearing formed between the third member and the bearing member. For example, the bearing member movably supports (guides) the third member to be moved straight in the direction parallel to the first axis, so that the table to which the third member is connected can be moved straight in the direction parallel to the first axis. That is, a decrease in straightness in the movement of the third member and the table is suppressed by the bearing member that can form the gas bearing. That is, the gas bearing is formed between the third member and the bearing member, so that the bearing member supports the third member in a non-contact manner. Accordingly, the third member can be smoothly moved in the direction parallel to the first axis. When the bearing member comes in contact with the third member, resisting power may occur against the movement of the third member. As a result, the table and the third member may not be moved straight although the table and the third member are intended to be moved straight. Further, when the bearing member comes in contact with the third member, vibration may occur due to the movement of the third member. When the vibration occurs in the third member, the table also vibrates, and as a result, the positioning accuracy of the table may be decreased. In the present invention, the bearing member movably supports the third member in a non-contact manner. Therefore, the table and the third member can be moved straight. Further, the occurrence of vibration is suppressed. As a result, the decrease in the positioning accuracy of the table is suppressed, and the table and an object supported by the table can be arranged in a target position. Further, according to the present invention, the support device includes the parallel pin, and the second member is connected to the table through the parallel pin. Accordingly, a relative position between the table and the support device (parallel pin) and a relative position between the second member and the support device (parallel pin) are secured, and rattling between the table and the support device and rattling between the second member and the support device are suppressed. Further, according to the present invention, the table is flexibly supported by the support device including the parallel pin. Accordingly, for example, even if the second member performs undesired movement (vibration), transmission of the undesired movement (vibration) to the table is suppressed by the support device.

In the table device according to an aspect of the present invention, the bearing member includes a first supply port supplying a gas between the bearing member and a side surface of the third member, and the first supply port continuously faces the side surface of the third member in a moving range of the third member relative to the direction parallel to the first axis.

Therefore, the gas bearing can be continuously formed between the third member and the bearing member in the moving range of the third member, and the non-contact state between the third member and the bearing member can be maintained.

In the table device according to an aspect of the present invention, a dimension of the third member is larger than a dimension of the bearing member relative to the direction parallel to the first axis.

Therefore, the third member protruding from an upper end portion of the bearing member can be smoothly connected to the table. Further, the third member also protrudes from a lower end portion of the bearing member, so that balance of a mass (weight) between the upper end portion side and the lower end portion side of the bearing member is improved. Accordingly, the third member can be moved straight.

In the table device according to an aspect of the present invention, a center of the third member is continuously arranged between one end portion and the other end portion of the bearing member relative to the direction parallel to the first axis in a moving range of the third member.

Therefore, even during the movement of the third member, the balance of a mass (weight) between the upper end portion side and the lower end portion side of the bearing member is improved. Therefore, the third member can be moved straight.

In the table device according to an aspect of the present invention, an external shape of a cross section of the third member parallel to the predetermined plane is a circle.

Therefore, in manufacturing of the third member, high machining accuracy can be easily obtained, and a target shape can be easily obtained. Therefore, unevenness of a dimension of a gap formed between the side surface of the third member and the bearing member is suppressed. Therefore, a decrease in performance of the gas bearing formed between the third member and the bearing member is suppressed, and movement of the third member deviating from the target trajectory is suppressed.

In the table device according to an aspect of the present invention, at least two third members are arranged, and are respectively connected to a first portion of the table and a second portion of the table, the second portion being different from the first portion.

Therefore, for example, rotation of the table is suppressed by the plurality of third members connected to the table. Accordingly, the positioning accuracy of the table is improved.

In the table device according to an aspect of the present invention, the first member is moved in a direction parallel to a second axis in the predetermined plane, and the table device comprises a suppression member suppressing movement of the second member relative to the direction parallel to the second axis.

Therefore, even if the first member is moved in the direction parallel to the second axis, movement of the second member in the direction parallel to the second axis is suppressed. Accordingly, the movement of the first member relative to the direction parallel to the second axis is efficiently converted into the movement of the second member relative to the direction parallel to the first axis.

The table device according to an aspect of the present invention includes a second guide device, at least a part of the second guide device being arranged in the suppression member, and the second guide device guiding the second member in the direction parallel to the first axis.

Therefore, the second member can be guided by the second guide device and can be moved in the direction parallel to the first axis. By the movement of the second member in the direction parallel to the first axis, the table supported by the second member can also be moved in the direction parallel to the first axis together with the second member.

In the table device according to an aspect of the present invention, the third member includes an upper surface and a lower surface, and at least a part of a side of the upper surface is connected to the table. The table device includes an actuator generating power for moving the first member, and a gravity compensation device including a second supply port arranged such that the second supply port faces a space that the lower surface of the third member faces and supplying a gas to the space.

Therefore, an action of the weight of the table on the actuator is decreased with the gas supplied through the second supply port to the space that the lower surface of the third member faces. That is, the gravity compensation device supplies the gas through the second supply port to the space to decrease force to be transmitted from the table to the actuator by an action of gravity. Therefore, a load applied on the actuator is decreased. Therefore, generation of heat of the actuator is suppressed, and thermal deformation of members around the actuator is suppressed. Further, thermal deformation of members of the table device is suppressed. Therefore, the decrease in the positioning accuracy of the table is suppressed, and a decrease in performance of the table device is suppressed.

The table device according to an aspect of the present invention includes a support member, at least a part of the support member being arranged around the third member and the bearing member, and the support member supporting the bearing member. The second supply port supplies the gas to a space defined by the lower surface of the third member and an inner surface of the support member.

Therefore, the gas is supplied to the space closed by the lower surface of the third member and the inner surface of the support member. Therefore, a pressure in the space can be favorably adjusted with the gas supplied through the second supply port.

In the table device according to an aspect of the present invention, the gravity compensation device supplies the gas through the second supply port to make a pressure in the space that the lower surface faces higher than a pressure in a space outside the support member.

Therefore, the gravity compensation device can apply upward force to the third member and the table to offset downward force in a vertical direction by an own weight of the table. Therefore, a load applied to the actuator is decreased.

A conveyance device according to an aspect of the present invention for achieving the above objective includes the table device.

Therefore, the conveyance device can convey an object supported by the table to a target position.

A semiconductor manufacturing device according to an aspect of the present invention for achieving the above objective includes the above-described table device.

Therefore, the semiconductor manufacturing device can process an object arranged in the target position. Therefore, manufacturing of a defective product from the object is suppressed. Note that the semiconductor manufacturing device includes an exposure device, for example, and is used in at least a part of a process of manufacturing a semiconductor device.

A flat panel display manufacturing device according to an aspect of the present invention for achieving the above objective includes the above-described table device.

Therefore, the flat panel display manufacturing device can process an object arranged in the target position. Therefore, manufacturing of a defective product from the object can be suppressed. Note that the flat panel display manufacturing device includes an exposure device, for example, and is used in at least a part of a process of manufacturing a flat panel display. The flat panel display includes at least one of a liquid crystal display, a plasma display, and an organic EL display.

Advantageous Effects of Invention

According to the table device and the conveyance device of the present invention, deviation of the table from the target trajectory is suppressed, and the decrease in the positioning accuracy is suppressed.

DESCRIPTION OF EMBODIMENTS

Hereinafter, embodiments according to the present invention will be described with reference to the drawings. However, the present invention is not limited to the embodiments. Conditions of the embodiments described below can be appropriately combined. Further, there is a case where a part of configuration elements may not be used. In the description below, an XYZ orthogonal coordinate system is provided, and positional relationships of respective units will be described with reference to the XYZ orthogonal coordinate system. One direction in a horizontal plane is an X axis direction, a direction perpendicular to the X axis direction in the horizontal plane is a Y axis direction, a direction perpendicular to the X axis direction and the Y axis direction (that is, a vertical direction) is a Z axis direction. Further, rotation (inclination) directions around an X axis, a Y axis, and a Z axis are θX, θY, and θZ directions, respectively. The X axis is perpendicular to a YZ plane. The Y axis is perpendicular to an XZ plane. The Z axis is perpendicular to an XY plane.

Figure 1:
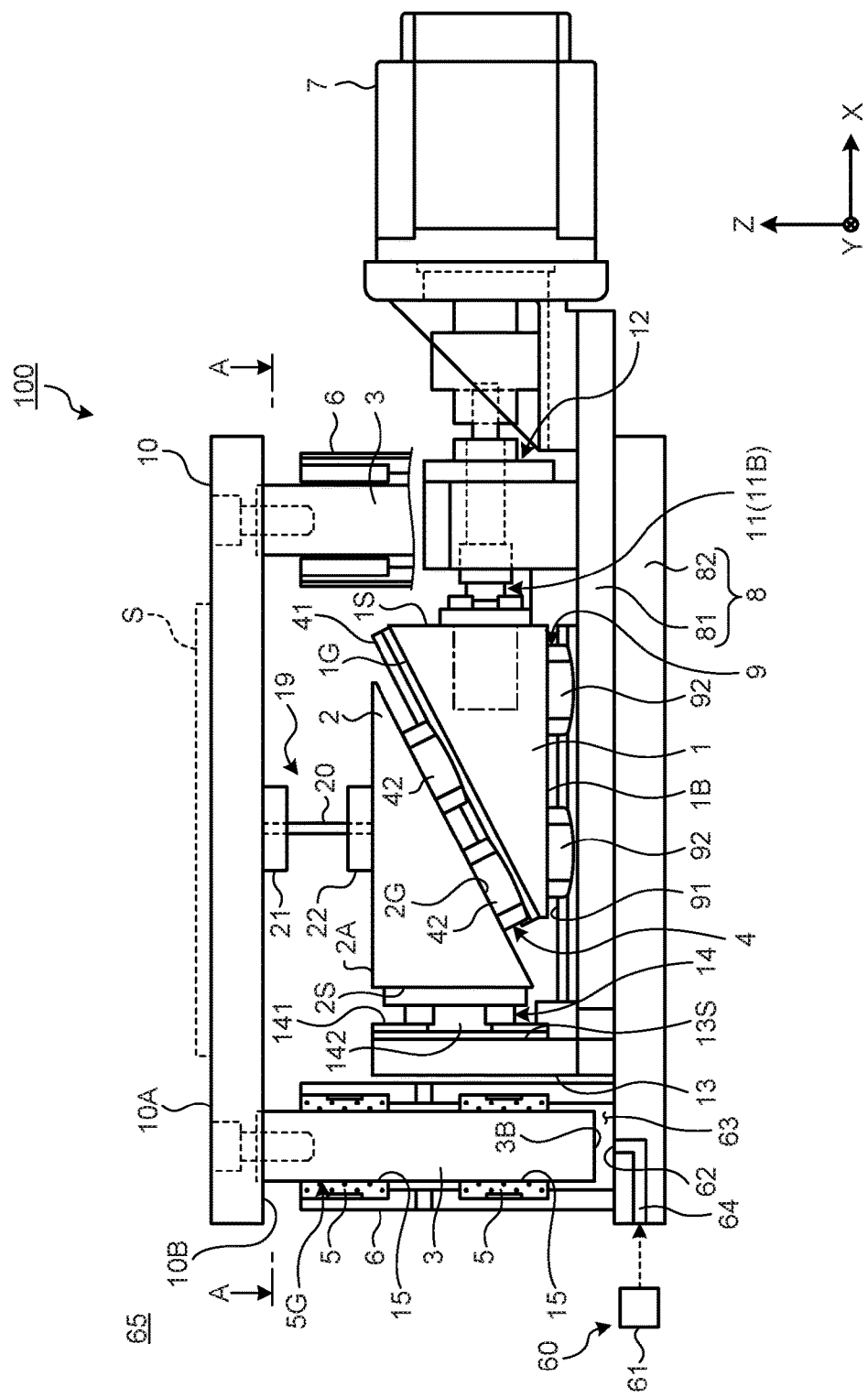
FIG. 1 is a front view illustrating an example of a table device according to the present embodiment.
Figure 2:
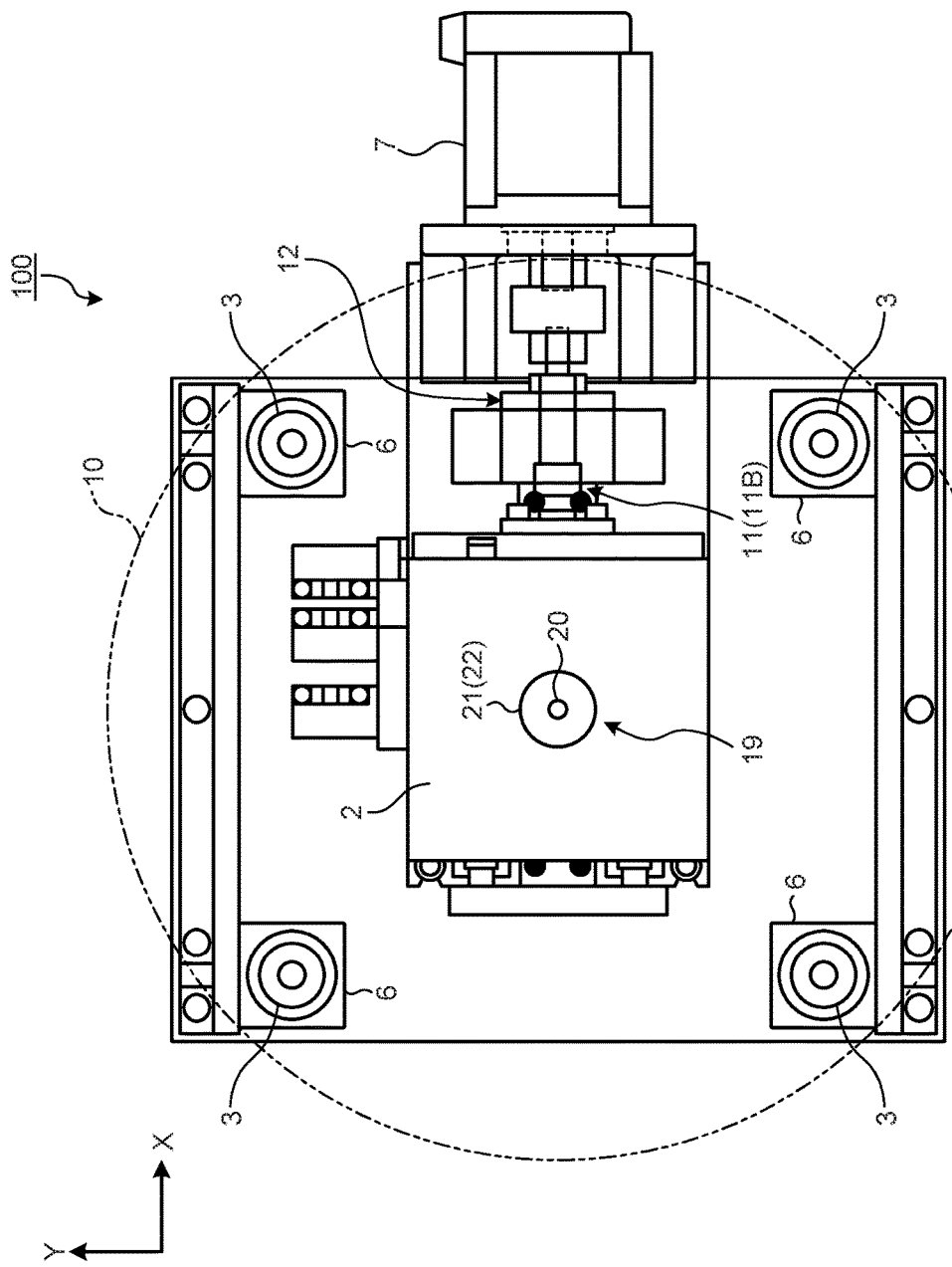
FIG. 2 is an A-A line arrow view of FIG. 1.
Figure 3:
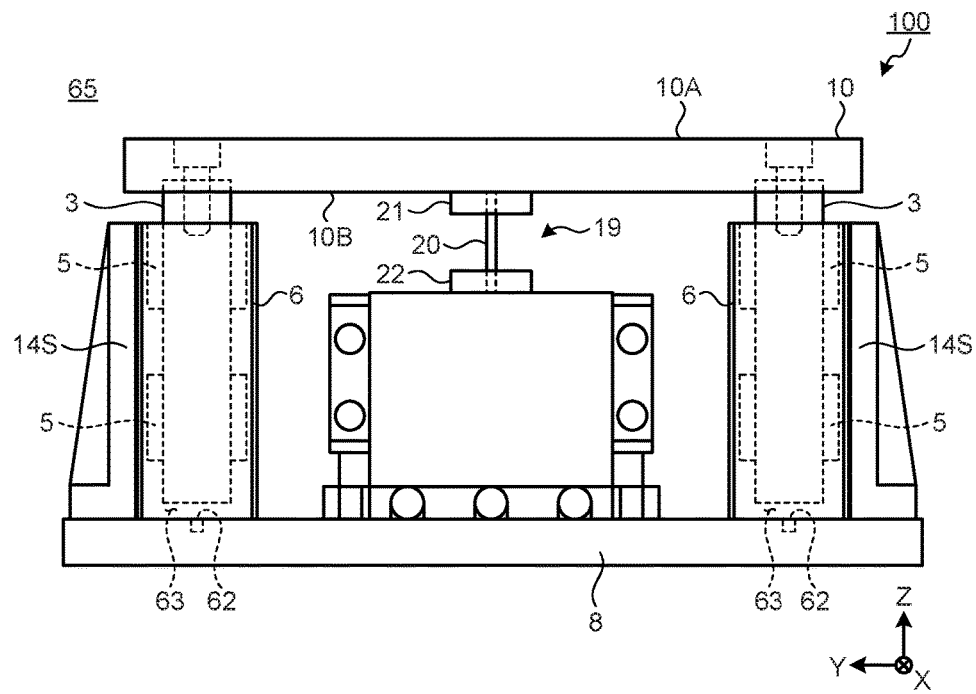
FIG. 3 is a side view illustrating an example of the table device according to the present embodiment.
Figure 4:
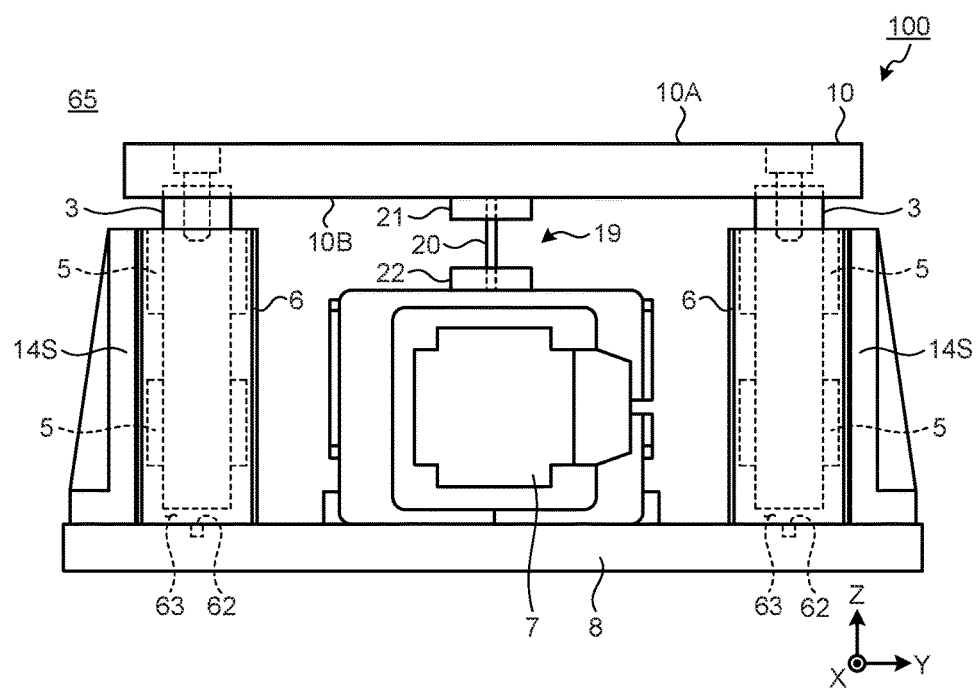
FIG. 4 is a side view illustrating an example of the table device according to the present embodiment.
Figure 5:
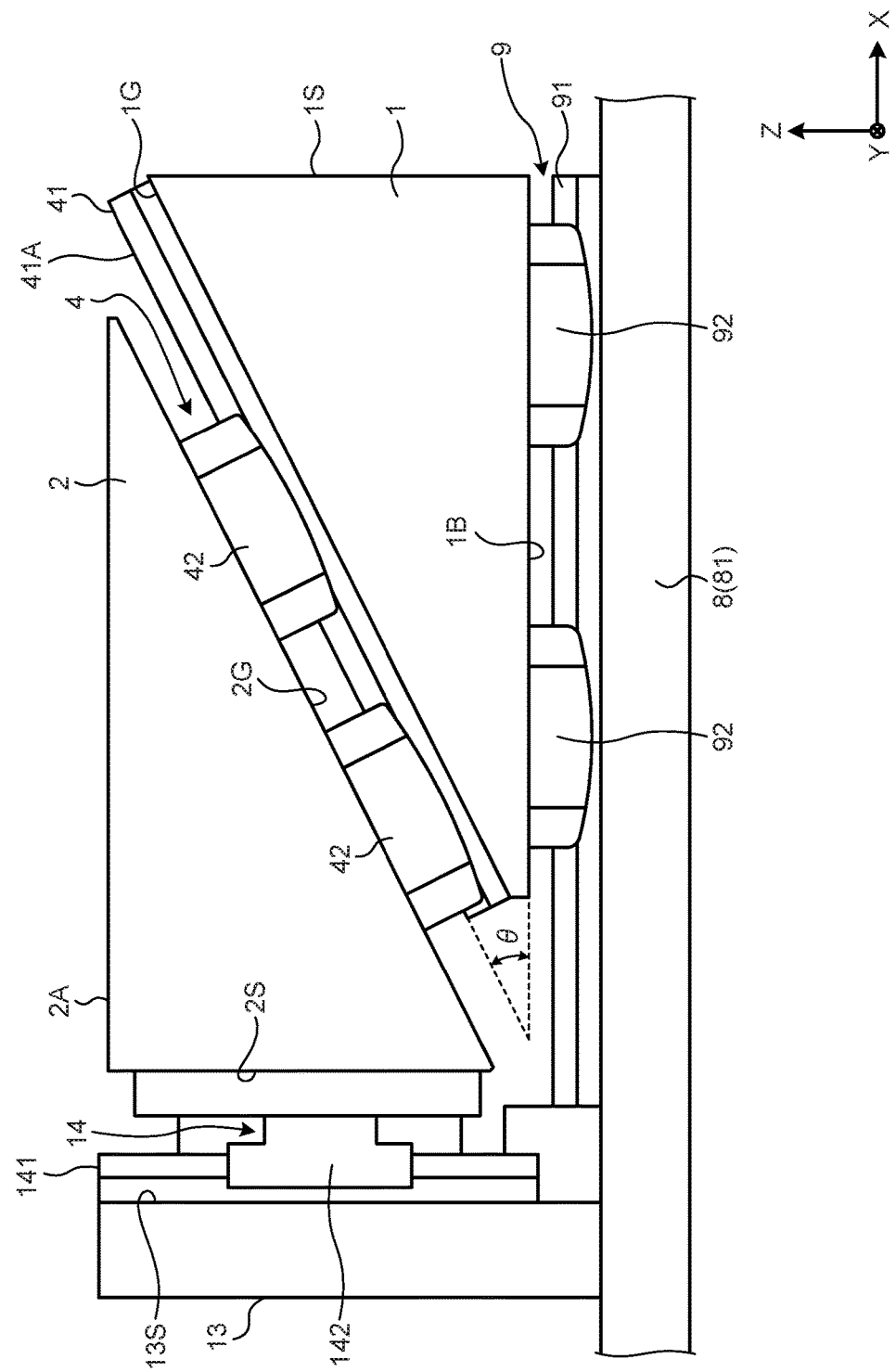
FIG. 5 is a diagram of an enlarged part of FIG. 1.

FIG. 1 is a diagram illustrating an example of a table device 100 according to the present embodiment. FIG. 2 is an A-A line arrow view of FIG. 1. FIG. 3 is a diagram of the table device 100 of FIG. 1 as viewed from a −X side. FIG. 4 is a diagram of the table device 100 of FIG. 1 as viewed from a +X side. FIG. 5 is a diagram of an enlarged part of FIG. 1.

The table device 100 includes a table 10 that can support an object S, a first member 1 movable in the XY plane (horizontal plane), a second member 2 relatively movable to the first member 1, a guide device 4 that has at least a part thereof arranged in the first member 1, and guides the second member 2 such that the second member 2 is moved in the Z axis direction by movement of the first member 1, a third member 3 connected to at least a part of the table 10, a bearing member 5 that forms a gas bearing 5G between the bearing member 5 and the third member 3, and movably supports the third member 3 in the Z axis direction, and a support device 19 that flexibly supports the table 10. The bearing member 5 includes a supply port 15 that can supply a gas between the bearing member 5 and the third member 3, and forms the gas bearing 5G between the bearing member 5 and the third member 3 with the gas supplied through the supply port 15 to support the third member 3 in a non-contact manner. The table 10 is supported by the second member 2 through the support device 19.

Further, the table device 100 includes a support member 6 that supports the bearing member 5, an actuator 7 that generates power for moving the first member 1, and a gravity compensation device 60 for decreasing an action of a weight of the table 10 on the actuator 7. The gravity compensation device 60 includes a supply port 62 capable of supplying a gas, and supplies the gas through the supply port 62 to decrease the action of the weight of the table 10 on the actuator 7.

Further, the table device 100 includes a base member 8. In the present embodiment, the base member 8 includes a first base member 81 and a second base member 82 that supports the first base member 81. The base member 8 is arranged on a floor surface of a facility (for example, a factory) in which the table device 100 is installed.

The table 10 is supported by the second member 2. The third member 3 is connected to at least a part of the table 10. The table 10 includes an upper surface 10A facing a +Z direction, and a lower surface 10B facing an opposite direction (−Z direction) to the upper surface 10A. The object S is placed on the upper surface 10A of the table 10. The upper surface 10A can support the object S.

The first member 1, the second member 2, and the third member 3 are arranged to the lower surface 10B side (−Z side) of the table 10. The second member 2 supports the table 10 at the lower surface 10B side (−Z side) of the table 10. The third member 3 is connected to the lower surface 10B of the table 10.

The first member 1, the second member 2, and the third member 3 are movable members. The first member 1, the second member 2, and the third member 3 are moved in a space below the table 10 (a space at the −Z side). The first member 1, the second member 2, and the third member 3 are moved in a space above the base member 8 (a space at the +Z side).

The first member 1 is movable in the XY plane. In the present embodiment, the first member 1 is movable in the X axis direction. An external shape of the first member 1 in the XZ plane is a substantially triangle (wedge shape). As illustrated in FIGS. 1 and 5, the first member 1 includes a lower surface 1B parallel to the XY plane, a slope 1G inclined with respect to the XY plane, and a side surface 1S parallel to the Z axis. The slope 1G and the side surface 1S are arranged at an upper side (+Z side) than the lower surface 1B. The slope 1G is inclined upward (+Z direction)

toward the +X direction. A lower end portion of the slope 1G and end portion of the lower surface 1B at the −X side are connected. An upper end portion of the slope 1G and an upper end portion of the side surface 1S are connected. A lower end portion of the side surface 1S and an end portion of the lower surface 1B at the +X side are connected.

The second member 2 is movably supported by the first member 1. The first member 1 and the second member 2 are relatively movable. The second member 2 is moved relative to the first member 1 above the first member 1 (+Z side).

The second member 2 is movable at least in the Z axis direction. In the present embodiment, the second member 2 is moved in the Z axis direction by movement of the first member 1 relative to the X axis direction. An external shape of the second member 2 in the XZ plane is substantially a triangle (wedge shape). As illustrated in FIGS. 1 and 5, the second member 2 includes an upper surface 2A parallel to the XY plane, a slope 2G inclined with respect to the XY plane, and a side surface 2S parallel to the Z axis. The upper surface 2A is arranged at an upper side (+Z side) than the side surface 2S and the slope 2G. The slope 2G is inclined upward (+Z direction) toward the +X direction. In the present embodiment, the slope 1G and the slope 2G are parallel. An upper end portion of the slope 2G and an end portion of the upper surface 2A at the +X side are connected. A lower end portion of the slope 2G and a lower end portion of the side surface 2S are connected. An upper end portion of the side surface 2S and an end portion of the upper surface 2A at the −X side are connected.

A guide device 4 guides the second member 2 such that the second member 2 is moved in the Z axis direction by movement of the first member 1 relative to the X axis direction. At least a part of the guide device 4 is arranged on the first member 1. In the present embodiment, the guide device 4 includes a rail 41 arranged on the first member 1, and a slider 42 arranged on the second member 2 and movable on the rail 41. The rail 41 is arranged on a slope 1G of the first member 1. The slider 42 is arranged on the slope 2G of the second member 2.

The guide device 4 includes a linear bearing. In the present embodiment, the guide device 4 includes a rolling bearing. The rolling bearing includes a rolling element. The rolling element includes one or both of a ball and a roller. That is, the rolling bearing includes one or both of the ball bearing and the roller bearing. In the present embodiment, the guide device 4 includes a linear ball bearing.

Figure 6:
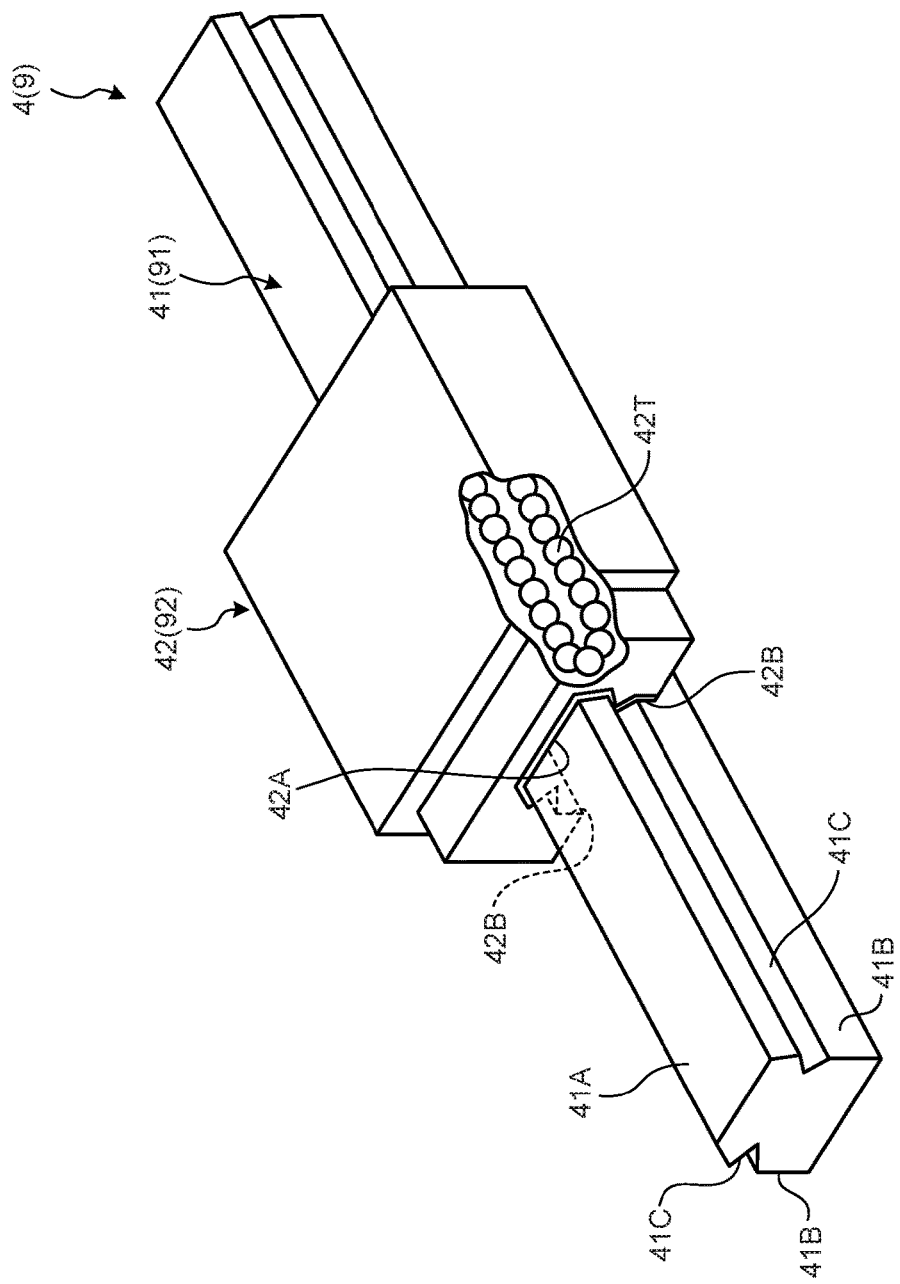
FIG. 6 is a diagram illustrating an example of a guide device according to the present embodiment.

FIG. 6 is a diagram illustrating an example of the guide device 4 according to the present embodiment. The rail 41 includes a surface 41A facing above, side surfaces 41B arranged at both sides of the surface 41A, and grooves 41C formed in the respective side surfaces 41B. The slider 42 includes a first counterface surface 42A that can face the surface 41A of the rail 41, second counterface surfaces 42B that can face the side surfaces 41B of the rail 41, a rolling element (ball) 42T, at least a part of which is arranged in the groove 41C of the rail 41. The ball 42T rolls while being in contact with an inner surface of the groove 41C. The ball 42T rolls along the groove 41C, so that the slider 42 is smoothly movable on the rail 41.

In the present embodiment, the rail 41 is arranged on the first member 1 (slope 1G) to be inclined with respect to the XY plane. The rail 41 is arranged such that the surface 41A of the rail 41 is inclined with respect to the XY plane. As illustrated in FIG. 5, in the present embodiment, an inclined angle of the rail 41 (surface 41A) with respect to the XY plane is θ. The angle θ is larger than 0 degrees and smaller than 90 degrees. The slider 42 is arranged on the second member 2 (slope 2G) such that the first counterface surface 42A and the surface 41A of the rail 41 become parallel. In the present embodiment, two sliders 42 are arranged on the slope 2G of the second member 2. Note that one slider 42 may be arranged on the second member 2. Three or more sliders 42 may be arranged on the second member 2.

The second member 2 is guided by the guide device 4 to be moved in the Z axis direction by movement of the first member 1 relative to the X axis direction. When the first member 1 is moved in the −X direction, the second member 2 is moved (ascends) in the +Z direction. When the first member 1 is moved in the +X direction, the second member 2 is moved (descends) in the −Z direction. The table 10 is supported by the second member 2. Therefore, by the movement (descent and ascent) of the second member 2 relative to the Z axis direction, the table 10 is also moved (descends and ascends) together with the second member 2. That is, when the second member 2 is moved (ascends) in the +Z direction, the table 10 is moved in the +Z direction together with the second member 2. When the second member 2 is moved (descends) in the −Z direction, the table 10 is moved in the −Z direction together with the second member 2.

Note that the slider 42 may be arranged on the slope 1G of the first member 1 and the rail 41 may be arranged on the slope 2G of the second member 2 in the guide device 4.

The external shape of the first member 1 is substantially a triangle (wedge shape). The external shape of the second member 2 is also substantially a triangle (wedge shape). That is, in the present embodiment, the table device 100 includes a so-called wedge-shaped lifting device. The first member 1 may be called a wedge member (first wedge member) 1. The second member 2 may be called a wedge member (second wedge member) 2.

The actuator 7 can move the first member 1 in the XY plane. The actuator 7 generates power for moving the first member 1. The actuator 7 generates power such that the first member 1 is moved in the XY plane. In the present embodiment, the first member 1 is moved in the X axis direction by the operation of the actuator 7. The actuator 7 includes a rotary motor, and is operated by the supplied power. As illustrated in FIGS. 1 and 2, the actuator 7 and the first member 1 are connected through a power transmission device 11. The power (driving force) of the actuator 7 is transmitted to the first member 1 through the power transmission device 11.

In the present embodiment, the power transmission device 11 converts a rotary motion of the actuator 7 into a linear motion. In the present embodiment, a shaft of the actuator 7 is rotated in a θX direction. The power transmission device 11 converts the rotary motion in the θX direction into the linear motion in the X axis direction, and transmits the linear motion to the first member 1. The first member 1 is moved in the X axis direction by the power (driving force) of the actuator 7 transmitted through the power transmission device 11.

In the present embodiment, the power transmission device 11 includes a ball screw 11B. The ball screw 11B includes a screw shaft rotated by the operation of the actuator 7, a nut connected to the first member 1 and arranged around the screw shaft, and a ball arranged between the screw shaft and the nut. The screw shaft of the ball screw 11B is rotatably supported by a support bearing 12. In the present embodiment, the ball screw 11B is rotated in the θX direction. The ball screw 11B is rotated in the θX direction, so that the nut and the first member 1 to which the nut is connected are moved in the X axis direction (linearly moved).

When the actuator 7 rotates the screw shaft of the ball screw 11B into one direction, the first member 1 is moved in the +X direction by the rotation of the screw shaft. When the actuator 7 rotates the screw shaft of the ball screw 11B into the opposite direction, the first member 1 is moved in the −X direction by the rotation of the screw shaft. That is, the moving direction of the first member 1 relative to the X axis direction (one of the +X direction and the −X direction) is determined based on the rotating direction of the actuator 7 (the rotating direction of the screw shaft of the ball screw 11B). The moving direction of the second member 2 (table 10) relative to the Z axis direction (one of the −Z direction and the +Z direction) is determined based on the moving direction of the first member 1.

As illustrated in FIGS. 1 and 5, the table device 100 includes a guide device 9 that guides the first member 1. The guide device 9 guides the first member 1 in the X axis direction. The guide device 9 guides the first member 1 such that the first member 1 is moved in the X axis direction by the operation of the actuator 7. At least a part of the guide device 9 is arranged on the base member 8. In the present embodiment, the guide device 9 includes a rail 91 arranged on the base member 8, and a slider 92 arranged on the first member 1 and movable on the rail 91. The rail 91 is arranged on an upper surface of the base member 8. The slider 92 is arranged on the lower surface 1B of the first member 1.

The guide device 9 includes a linear bearing. In the present embodiment, the guide device 9 includes a linear ball bearing. The first member 1 is guided to be moved in the X axis direction by the guide device 9 by the operation of the actuator 7. The guide device 9 has an equivalent structure and the like to the guide device 4 described with reference to FIG. 6. Detailed description of the guide device 9 is omitted.

Note that the slider 92 may be arranged on the upper surface of the base member 8 and the rail 91 may be arranged on the lower surface 1B of the first member 1 in the guide device 9.

The table device 100 includes a suppression member 13 that suppresses the movement of the second member 2 relative to the X axis direction. The suppression member 13 is arranged at a more −X side than the first member 1 and the second member 2. At least a part of the second member 2 is arranged between the first member 1 and the suppression member 13 relative to the X axis direction. The suppression member 13 is fixed to the base member 8.

For example, there is a possibility that the second member 2 is moved in the −X direction together with the first member 1 by the movement of the first member 1 in the −X direction. Further, there is a possibility that the second member 2 is moved in the +X direction together with the first member 1 by the movement of the first member 1 in the +X direction. In the present embodiment, movement of the second member 2 in the X axis direction is suppressed by the suppression member 13. Accordingly, the movement of the first member 1 relative to the X axis direction is efficiently converted into the movement of the second member 2 relative to the Z axis direction.

Further, the suppression member 13 receives force from the second member 2, the force acting in the X axis direction. Therefore, the action of the force relative to the X axis direction from the second member 2 on the third member 3 and the bearing member 5 is suppressed. Accordingly, the dimension of the gap between the third member 3 and the bearing member 5 is maintained, and the gas bearing 5G can guide the third member 3 in the Z axis direction.

In the present embodiment, the table device 100 includes a guide device 14, at least a part of which is arranged in the suppression member 13, and which guides the second member 2. The guide device 14 guides the second member 2 in the Z axis direction. As illustrated in FIGS. 1 and 5, in the present embodiment, the guide device 14 includes a rail 141 arranged on the suppression member 13, and a slider 142 arranged on the second member 2 and movable on the rail 141. The slider 142 is arranged on the side surface 2S of the second member 2. The rail 141 is arranged on a side surface 13S of the suppression member 13 to face the slider 142.

The guide device 14 includes a linear bearing. In the present embodiment, the guide device 14 includes a linear rolling bearing. The guide device 14 may include a linear ball bearing as described with reference to FIG. 6.

Note that the slider 142 may be arranged on the side surface 13S of the suppression member 13 and the rail 141 may be arranged on the side surface 2S of the second member 2 in the guide device 14.

Note that, in the present embodiment, the guide device 4 includes a rolling bearing that includes a rolling element. The guide device 4 may include a linear slide bearing without including a rolling element, or may include a linear gas bearing. The guide device 4 may not include a slider. For example, the slope 2G of the second member 2 may be moved along the rail provided on the first member 1 such that the second member 2 is moved in the Z axis direction. In this case, the rail provided on the first member 1 functions as a guide device that guides the second member 2. Similarly, the guide device 9 may include a linear slide bearing, or may include a linear gas bearing. The guide device 9 may not include a slider. Similarly, the guide device 14 may include a linear slide bearing, or may include a linear gas bearing. The guide device 14 may not include a slider.

The third member 3 is movable in the Z axis direction. The third member 3 is movably supported by the bearing member 5 that can form the gas bearing 5G. The bearing member 5 movably supports the third member 3 in the Z axis direction. A gas is supplied between the third member 3 and the bearing member 5, so that the gas bearing 5G is formed between the third member 3 and the bearing member 5. By formation of the gas bearing 5G between the third member 3 and the bearing member 5, the third member 3 is supported by the bearing member 5 in a non-contact manner.

Figure 7:
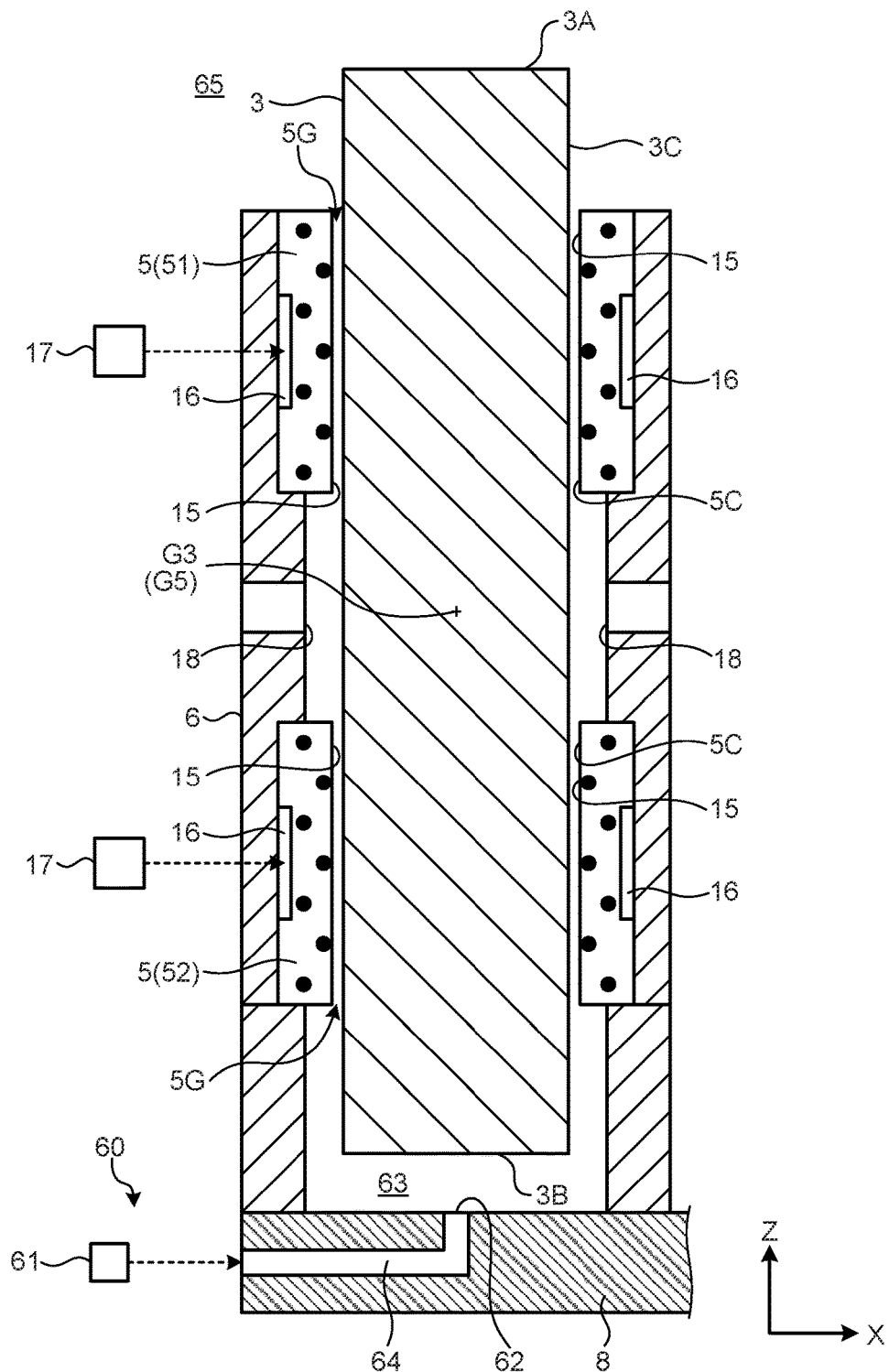
FIG. 7 is a sectional view illustrating an example of a gas bearing according to the present embodiment.
Figure 8:
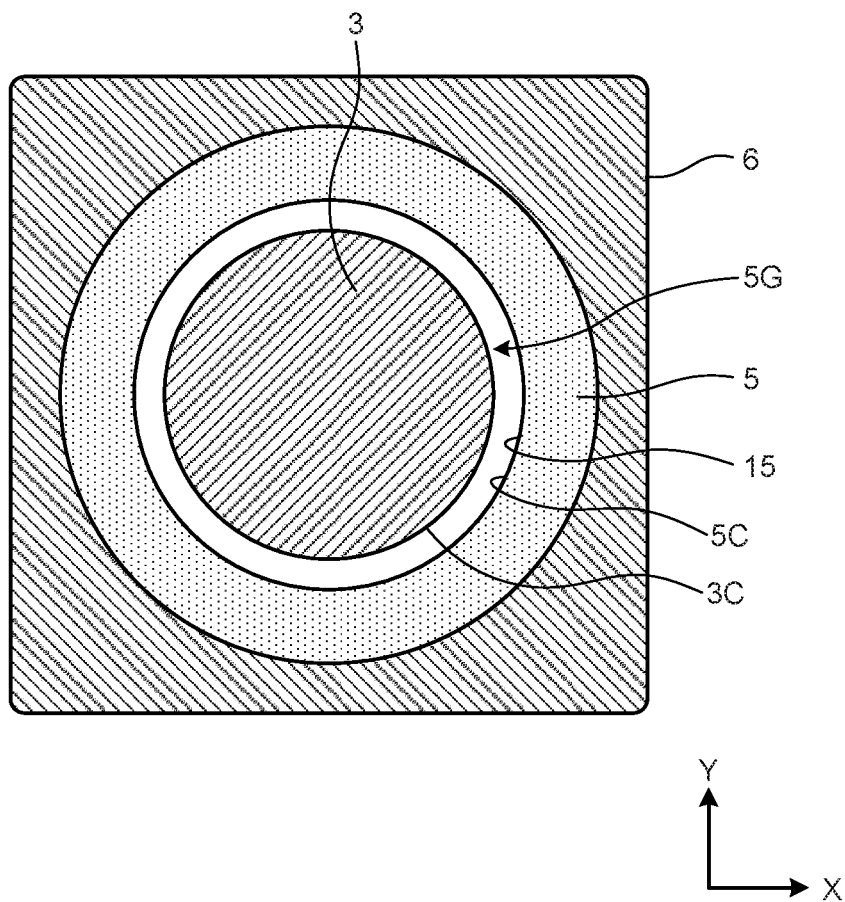
FIG. 8 is a sectional view illustrating an example of the gas bearing according to the present embodiment.

FIG. 7 is a sectional view of the third member 3, the bearing member 5, and the support member 6, parallel to the XZ plane. FIG. 8 is a sectional view of the third member 3, the bearing member 5, and the support member 6, parallel to the XY plane. In the present embodiment, the third member 3 is a rod-like member long in the Z axis direction. The third member 3 includes an upper surface 3A facing the +Z direction, a lower surface 3B facing the −Z direction, and a side surface (outer surface) 3C connecting the upper surface 3A and the lower surface 3B. As illustrated in FIG. 8, in the present embodiment, an external shape of a cross section of the third member 3 parallel to the XY plane is a circle. That is, the third member 3 is a columnar member long in the Z axis direction. An axis of the third member 3 is parallel to the Z axis. An inside of the third member 3 may be a cavity. For example, the third member 3 may be a cylindrical member long in the Z axis direction.

The bearing member 5 is a cylindrical member arranged around the side surface 3C of the third member 3. The bearing member 5 is a cylindrical member. An axis of the bearing member 5 is parallel to the Z axis. In the present embodiment, the axis of the third member 3 and the axis of the bearing member 5 are matched. In other words, the axis of the third member 3 and the axis of the bearing member 5 are the same axis. The bearing member 5 includes an inner surface 5C that can face the side surface 3C of the third member 3. The inner surface 5C may be called bearing surface 5C. In the present embodiment, two bearing members 5 are arranged relative to the Z axis direction parallel to the axis of the bearing member 5. In the description below, the bearing member 5 arranged at the +Z side is appropriately called bearing member 51, and the bearing member 5 arranged at a more −Z side than the bearing member 51 is appropriately called bearing member 52, of the two bearing members 5 arranged in the Z axis direction.

The support member 6 supports the bearing member 5. The bearing member 5 is fixed to the support member 6. The support member 6 movably supports the third member 3 through the bearing member 5. In the present embodiment, the support member 6 is a cylindrical member, at least a part of which is arranged around the third member 3 and the bearing member 5. An axis of the support member 6 is parallel to the Z axis. In the present embodiment, the axis of the third member 3, the axis of the bearing member 5, and the axis of the support member 6 are matched. In other words, the axis of the third member 3, the axis of the bearing member 5, and the axis of the support member 6 are the same axis. As illustrated in FIGS. 3 and 4, and other figures, the support member 6 is supported by a support device 14S. The support device 14S is fixed to the base member 8. In the present embodiment, the support member 6 is supported by the base member 8 through the support device 14S. The support member 6 is fixed to the support device 14S. In the present embodiment, the position of the support member 6 with respect to the base member 8 is fixed.

In the present embodiment, the support member 6 is arranged such that a lower surface of the support member 6 and the upper surface of the base member 8 are in contact with each other.

As illustrated in FIGS. 7 and 8, the bearing member 5 is arranged on an inner surface of the support member 6. The bearing member 5 is arranged around the side surface 3C of the third member 3. The inner surface 5C of the bearing member 5 and the side surface (outer surface) 3C of the third member 3 face each other. The inner surface 5C of the bearing member 5 faces the side surface 3C of the third member 3 through a gap.

The bearing member 5 supports the third member 3 in a non-contact manner. The bearing member 5 forms the gas bearing 5G between the bearing member 5 and the side surface 3C of the third member 3 with a gas supplied between the bearing member 5 and the side surface 3C of the third member 3. The bearing member 5 includes a supply port 15 that can supply the gas to between the bearing member 5 and the side surface 3C of the third member 3. In the present embodiment, the supply port 15 is arranged to face the side surface 3C of the third member 3. The supply port 15 is arranged in the inner surface 5C of the bearing member 5. The gas bearing 5G is formed between the side surface 3C of the third member 3 and the inner surface 5C of the bearing member 5 with the gas supplied through the supply port 15 to between the side surface 3C of the third member 3 and the inner surface 5C of the bearing member 5. With the gas bearing 5G, a gap is formed between the side surface 3C of the third member 3 and the inner surface 5C of the bearing member 5. In the present embodiment, the supply port 15 supplies air (compressed air).

The movement of the third member 3 relative to the X axis direction and the Y axis direction is restricted with the gas bearing 5G formed around the side surface 3C of the third member 3. The movement of the third member 3 relative to the X axis direction and the Y axis direction is suppressed with the gas bearing 5G, and the movement of the third member 3 relative to the Z axis direction is allowed.

In the present embodiment, the bearing member 5 includes a porous body (porous member). The porous body may be made of graphite (carbon graphite) as disclosed in Japanese Patent No. 5093056 and Japanese Laid-open Patent Publication No. 2007-120527. The porous body may be made of a ceramic. The supply port 15 includes a porous body hole. In the present embodiment, the gas is supplied through the porous body hole (supply port 15). As illustrated in FIG. 7, in the present embodiment, a cavity 16 is formed between the bearing member 5 and the support member 6. The gas is supplied from a gas supply device 17 to the cavity 16. The gas supplied to the cavity 16 passes the inside (the porous body hole) of the bearing member 5, reaches the inner surface 5C of the bearing member 5, and is supplied through the supply port 15 arranged in the inner surface 5C to the space between the inner surface 5C and the outer surface 3C. Accordingly, the gas bearing 5G is formed between the inner surface 5C and the outer surface 3C. The inner surface 5C and the outer surface 3C becomes a non-contact state.

In the present embodiment, a discharge port 18 through which at least a part of the gas supplied between the bearing member 5 and the third member 3 is discharged is provided. The discharge port 18 is arranged in the support member 6. The discharge port 18 is arranged between the bearing member 51 and the bearing member 52.

The third member 3 is connected to the table 10. The third member 3 is connected to the table 10 such that the upper surface 3A of the third member 3 and the lower surface 10B of the table 10 face each other. In the present embodiment, at least a part of the third member 3 at the upper surface 3A side is connected to the table 10. In other words, at least a part of an upper end portion of the third member 3 is connected to the table 10. The upper surface 3A of the third member 3 and the lower surface 10B of the table 10 may be or may not be in contact with each other. The third member 3 is fixed to the table 10. The third member 3 is fixed to the table 10 with a fixing member like a bolt.

As described above, the first member 1 is moved in the X direction by the operation of the actuator 7. The second member 2 and the table 10 supported by the second member 2 are moved in the Z axis direction by the movement of the first member 1 related to the X axis direction. In the present embodiment, the third member 3 connected to the table 10 is moved in the Z axis direction together with the table 10 by the movement of the table 10 relative to the Z axis direction. The third member 3 is guided by the bearing member 5 (gas bearing 5G) and moved in the Z axis direction. In the present embodiment, the bearing member 5 functions as a guide device that guides the third member 3 such that the third member 3 is moved in the Z axis direction. The inner surface 5C of the bearing member 5, the surface 5C facing the side surface 3C of the third member 3, may be called guide surface 5C. In the present embodiment, the side surface 3C and the inner surface 5C are parallel to the Z axis.

The dimension of the third member 3 is larger (longer) than the dimension of the bearing member 5 relative to the Z axis direction. In the present embodiment, the distance between the upper surface 3A and the lower surface 3B of the third member 3 is larger than the distance between an end portion (upper end portion) of the bearing member 51 at the +Z side and an end portion (lower end portion) of the bearing member 52 at the −Z side relative to the Z axis direction.

As illustrated in FIG. 7, in a state where a center G3 of the third member 3 and a center G5 of the bearing member 5 relative to the Z axis direction are matched, the end portion (upper end portion) of the third member 3 at the +Z side including the upper surface 3A is arranged at a more +Z side than the end portion (upper end portion) of the bearing member 5 (bearing member 51) at the +Z side, and the end portion (lower end portion) of the third member 3 at the −Z side including the lower surface 3B is arranged at a more −Z side than the end portion (lower end portion) of the bearing member 5 (bearing member 52) at the −Z side. In other words, in the state where the center G3 of the third member 3 and the center G5 of the bearing member 5 relative to the Z axis direction are matched, the upper end portion and the lower end portion of the third member 3 are arranged outside the bearing member 5 (the bearing member 51 and the bearing member 52).

Note that, in the present embodiment, the center G5 of the bearing member 5 relative to the Z axis direction is a center between the upper end portion of the bearing member 51 and the lower end portion of the bearing member 52. When the bearing member 5 is one, the center G5 of the bearing member 5 relative to the Z axis direction is the center between the upper end portion and the lower end portion of the bearing member 5. When three or more bearing members 5 are arranged relative to the Z axis direction, the center G5 of the bearing member 5 relative to the Z axis direction is the center between the upper end portion of the bearing member arranged at the most +Z side, and the lower end portion of the bearing member arranged at the most −Z side, of the plurality of bearing members.

Further, as illustrated in FIG. 7 and other figures, in the state where the center G3 of the third member 3 and the center G5 of the bearing member 5 relative to the Z axis direction are matched, the end portion (upper end portion) of the third member 3 at the +Z side including the upper surface 3A is arranged at a more +Z side than an end portion (upper end portion) of the support member 6 at the +Z side. In other words, in the state where the center G3 of the third member 3 and the center G5 of the bearing member 5 relative to the Z axis direction are matched, the upper end portion of the third member 3 is arranged outside the support member 6.

Figure 9:
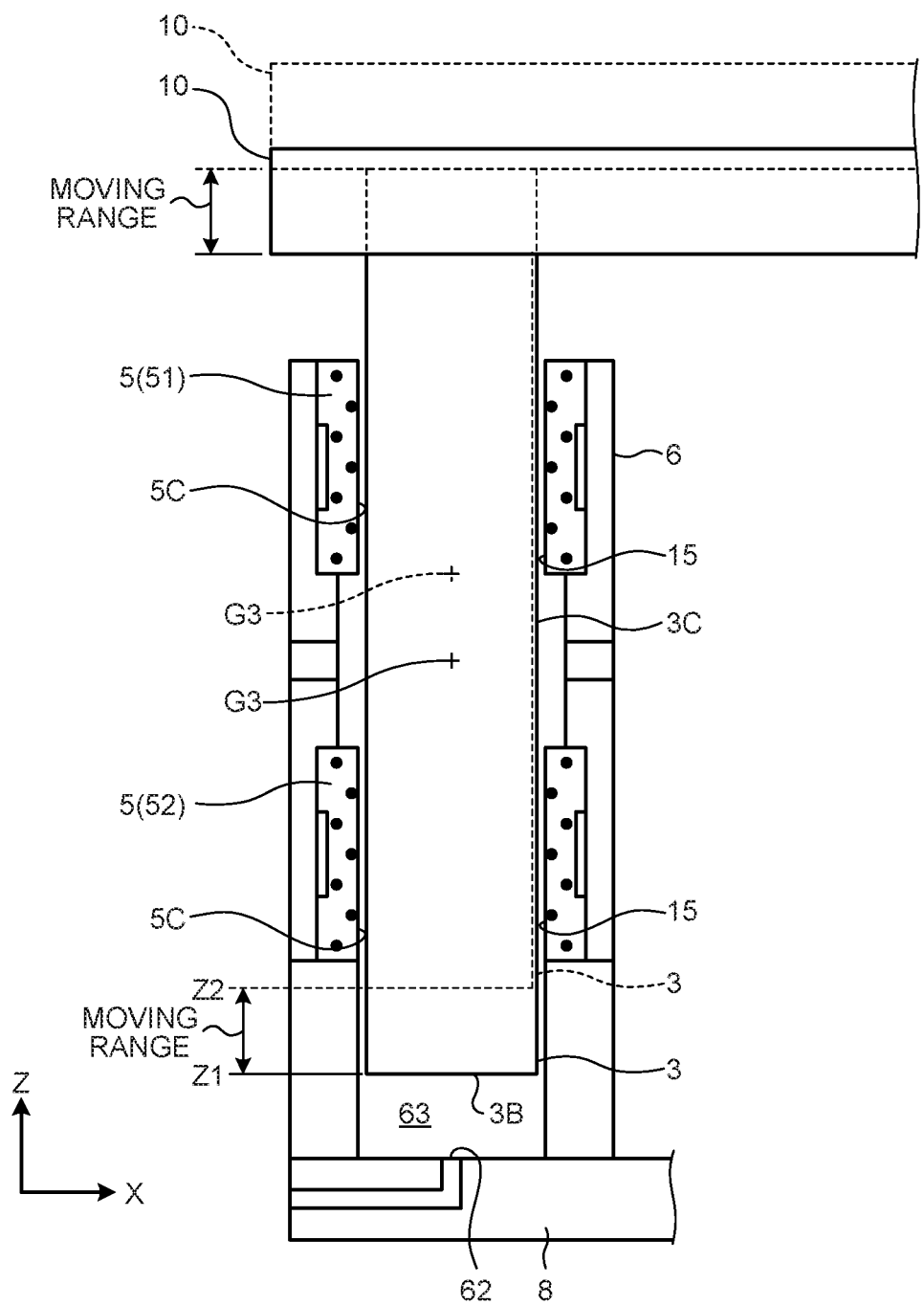
FIG. 9 is a diagram illustrating an example of an operation of the table device according to the present embodiment.

FIG. 9 is a diagram illustrating an example of a state where the table 10 and the third member 3 are moved relative to the Z axis direction. In the present embodiment, moving ranges (moving amounts, strokes) in which the table 10 and the third member 3 are movable relative to the Z axis direction are determined. In the present embodiment, the moving range of the first member 1 relative to the X axis direction is determined based on an operation amount (rotation amount) of the actuator 7. Further, the moving range of the second member 2 (table 10) relative to the Z axis direction is determined based on the moving range of the first member 1 relative to the X axis direction. Further, the third member 3 is connected to the table 10, and the moving range of the third member 3 relative to the Z axis direction is determined based on the moving range of the table 10 relative to the Z axis direction. As illustrated in FIG. 9, the table 10 and the third member 3 are movable between a position Z1 and a position Z2 at a more +Z side than the position Z1 relative to the Z axis direction. That is, the moving ranges in which the table 10 and the third member 3 are movable in the Z axis direction are the range between the position Z1 and the position Z2.

In the present embodiment, in the moving range of the third member 3 relative to the Z axis direction, the upper end portion of the third member 3 is continuously arranged outside the support member 6. In the moving range of the third member 3 relative to the Z axis direction, the upper end portion and the lower end portion of the third member 3 are continuously arranged outside the bearing member 5 (the bearing member 51 and the bearing member 52).

In the moving range of the third member 3 relative to the Z axis direction, the inner surface 5C of the bearing member 5 continuously faces the side surface 3C of the third member 3. In the moving range of the third member 3 relative to the Z axis direction, the supply port 15 continuously faces the side surface 3C of the third member 3. In other words, in the moving range of the third member 3 relative to the Z axis direction, the supply port 15 of the bearing member 5 and the side surface 3C of the third member 3 face each other even in a state where the third member 3 is arranged in the position Z1 at the most −Z side. In the moving range of the third member 3 relative to the Z axis direction, the supply port 15 of the bearing member 5 and the side surface 3C of the third member 3 face each other even in a state where the table 10 is arranged in the position Z2 at the most +Z side. That is, in the entire moving range of the third member 3 relative to the Z axis direction, the supply port 15 of the bearing member 5 and the side surface 3C of the third member 3 continuously face each other. Accordingly, in the moving range of the third member 3, the gas bearing 5G is continuously formed between the third member 3 and the bearing member 5.

Further, in the present embodiment, in the moving range of the third member 3 relative to the Z axis direction, the center G3 of the third member 3 relative to the Z axis direction is continuously arranged between the upper end portion and the lower end portion of the bearing member 5. In other words, in the moving range of the third member 3 relative to the Z axis direction, the center G3 is not arranged outside the bearing member 5. In the present embodiment, the moving range of the third member 3 relative to the Z axis direction is determined such that the center G3 is not arranged outside the bearing member 5.

Note that, in the present embodiment, the upper end portion of the bearing member 5 is the upper end portion of the bearing member 51. The lower end portion of the bearing member 5 is the lower end portion of the bearing member 52. When the bearing member 5 is one, the upper end portion of the bearing member 5 is the upper end portion of the one bearing member 5, and the lower end portion of the bearing member 5 is the lower end portion of the one bearing member 5. Further, when three or more bearing members 5 are arranged relative to the Z axis direction, the upper end portion of the bearing member 5 is the upper end portion of the bearing member arranged at the most +Z side, of the plurality of bearing members. The lower end portion of the bearing member 5 is the lower end portion of the bearing member arranged at the most −Z side, of the plurality of bearing members.

As illustrated in FIGS. 1, 3, 4, 7, 9, and other figures, in the present embodiment, the lower surface 3B of the third member 3 is separated from the base member 8. In the present embodiment, the third member 3 is connected with the table 10, and is not connected with members other than the table 10. In the present embodiment, the table 10 is connected to the upper surface 3A of the third member 3, and the bearing member 5 and the support member 6 are arranged around the side surface 3C in a non-contact state, and no members are connected to the lower surface 3B of the third member 3.

In the present embodiment, the support member 6 is arranged such that the lower surface of the support member 6 and the upper surface of the base member 8 are in contact with each other. The lower end portion of the support member 6 is arranged lower (at a more −Z side) than the lower end portion of the third member 3. A space 63 is defined by the lower surface 3B of the third member 3 and an inner surface of the support member 6. The lower surface 3B of the third member 3 faces the space 63. In the present embodiment, the space 63 includes a space surrounded by the lower surface 3B of the third member 3, the inner surface of the support member 6, and the upper surface of the base member 8.

The gravity compensation device 60 includes a supply port 62 that can supply a gas to the space 63 that the lower surface 3B of the third member 3 faces. The gravity compensation device 60 supplies the gas through the supply port 62 to decrease the action of the weight of the table 10 on the actuator 7. The gravity compensation device 60 may be called own weight compensation device 60 or may be called own weight cancellation device 60.

The gravity compensation device 60 includes a gas supply device 61 that can supply a gas, and a passage 64 in which the gas from the gas supply device 61 flows. In the present embodiment, at least a part of the passage 64 is formed inside the base member 8. The passage 64 connects the gas supply device 61 and the supply port 62. The supply port 62 is arranged in one end portion of the passage 64. In the present embodiment, the supply port 62 includes an opening of the one end portion of the passage 64. The other end portion of the passage 64 is connected with the gas supply device 61. The gas supplied from the gas supply device 61 is sent to the supply port 62 through the passage 64. The supply port 62 supplies the gas from the gas supply device 61 to the space 63.

The supply port 62 is arranged to face the space 63. In the present embodiment, the supply port 62 is arranged in the upper surface of the base member 8. The supply port 62 is arranged to face the lower surface 3B of the third member 3. Note that the supply port 62 may be arranged in the inner surface of the support member 6 to face the space 63.

The gas supply device 61 includes a flow rate adjustment device that can adjust an amount of the gas to be supplied per unit time. The flow rate adjustment device includes a regulator. The gas supply device 61 can adjust the amount of the gas to be supplied per unit time through the supply port 62 to the space 63, using the flow rate adjustment device. A pressure in the space 63 is adjusted by the adjustment of the amount of the gas to be supplied through the supply port 62. If the amount of the gas supplied through the supply port 62 is large, the pressure in the space 63 becomes high. If the amount of the gas supplied through the supply port 62 is small, the pressure in the space 63 becomes low. The gas supply device 61 can adjust the pressure in the space 63 by adjusting the amount of the gas to be supplied through the supply port 62 to the space 63. In the present embodiment, air (compressed air) is supplied through the supply port 62.

The gravity compensation device 60 supplies the gas through the supply port 62 to decrease the action of the weight of the table 10 on the actuator 7. The table 10 generates force in the −Z direction by the action of gravity. The force of the table 10 is transmitted to the actuator 7 through the second member 2, the first member 1, and the power transmission device 11. The gravity compensation device 60 supplies the gas through the supply port 62 to decrease the force to be transmitted from the table 10 to the actuator 7. The gravity compensation device 60 supplies the gas through the supply port 62 to suppress transmission of the force generated by the table 10 and the third member 3 by the action of gravity to the actuator 7.

In the present embodiment, the gravity compensation device 60 supplies the gas through the supply port 62 to decrease an action of a weight of the table 10 and the third member 3 on the actuator 7. The gravity compensation device 60 supplies the gas through the supply port 62 to decrease force to be transmitted from the table 10 and the third member 3 to the actuator 7 by the action of gravity. The gravity compensation device 60 applies force to the third member 3 and the table 10 in the +Z direction to offset the force in the −Z direction by the own weight of the table 10 and the third member 3. In other words, the gravity compensation device 60 applies force to the third member 3 and the table 10 in the +Z direction to cancel the force in the −Z direction by the action of gravity. That is, the gravity compensation device 60 supplies the gas to the space 63 below the table 10 and the third member 3 to push up the table 10 and the third member 3. In the present embodiment, the gravity compensation device 60 supplies the gas through the supply port 62 to make the pressure in the space 63 higher than a pressure in a space 65 outside the support member 6. The space 65 includes a space around the table 10. The space 65 includes a space around the upper surface 3A of the third member 3. The space 65 is an outside space to the space 63. In the present embodiment, the pressure in the space 65 is the atmospheric pressure. The gravity compensation device 60 supplies the gas through the supply port 62 to the space 63 to make the pressure in the space 63 higher than the atmospheric pressure.

The gravity compensation device 60 may supply the gas to the space 63 in consideration of the weight of the object S placed on the table 10. That is, the gravity compensation device 60 may supply the gas through the supply port 62 to decrease the action of the weight of the table 10, the third member 3, and the object S on the actuator 7. In other words, the gravity compensation device 60 may supply the gas through the supply port 62 to decrease the force to be transmitted from the table 10, the third member 3, and the object S by the action of gravity to the actuator 7.

In the present embodiment, the external shape of the cross section of the third member 3 parallel to the XY plane is a circle. Further, in the present embodiment, at least two third members 3 are arranged. That is, the table device 100 includes a plurality of the third members 3. In the present embodiment, the plurality of third members 3 is connected to a plurality of different portions of the table 10 in the XY plane, respectively. The bearing members 5, the support members 6, and the supply ports 62 are respectively arranged corresponding to the plurality of third members 3. The plurality of third members 3 is connected to the table 10, and the plurality of third members 3 is supported by the bearing members 5 and the support members 6, so that the movement of the table 10 in the XY plane is suppressed. That is, the plurality of third members 3 is connected to the plurality of different portions of the table 10 in the XY plane, respectively, and the plurality of third members 3 is supported by the bearing members 5 and the support members 6, so that the movement (rotation) of the table 10 relative to the θZ direction is suppressed.

For example, when two third members 3 are connected to the table 10, these third members 3 are respectively connected to a first portion of the table 10, and a second portion of the table 10, the second portion being different from the first portion. When three third members 3 are connected to the table 10, these third members 3 are respectively connected to the first portion of the table 10, the second portion of the table 10, the second portion being different from the first portion, and a third portion of the table 10, the third portion being different from the first and second portions.

As illustrated in FIGS. 1, 2, 3, and 4, and other figures, in the present embodiment, the four third members 3 are connected to the table 10. These third members 3 are respectively connected to the first portion on the lower surface 10B of the table 10, the second portion on the lower surface 10B of the table 10, the second portion being different from the first portion, the third portion on the lower surface 10B of the table 10, the third portion being different from the first and second portions, and the fourth portion on the lower surface 10B of the table 10, the fourth portion being different from the first, second and third portions. The first to fourth portions are arranged around a center of the lower surface 10B. In the present embodiment, the plurality of third members 3 is arranged in at least a part of the vicinity of the first member 1 and the second member 2. The bearing members 5 and the support members 6 are respectively arranged corresponding to the four third members 3.

Note that the table device 100 may include arbitrary five or more third members 3. The bearing members 5 and the support members 6 are respectively arranged corresponding to the plurality of third members 3. The plurality of third members 3 is connected to the table 10, and the plurality of third members 3 is supported by the bearing members 5 and the support members 6, so that the movement of the table 10 in the XY plane is suppressed.

Figure 10:
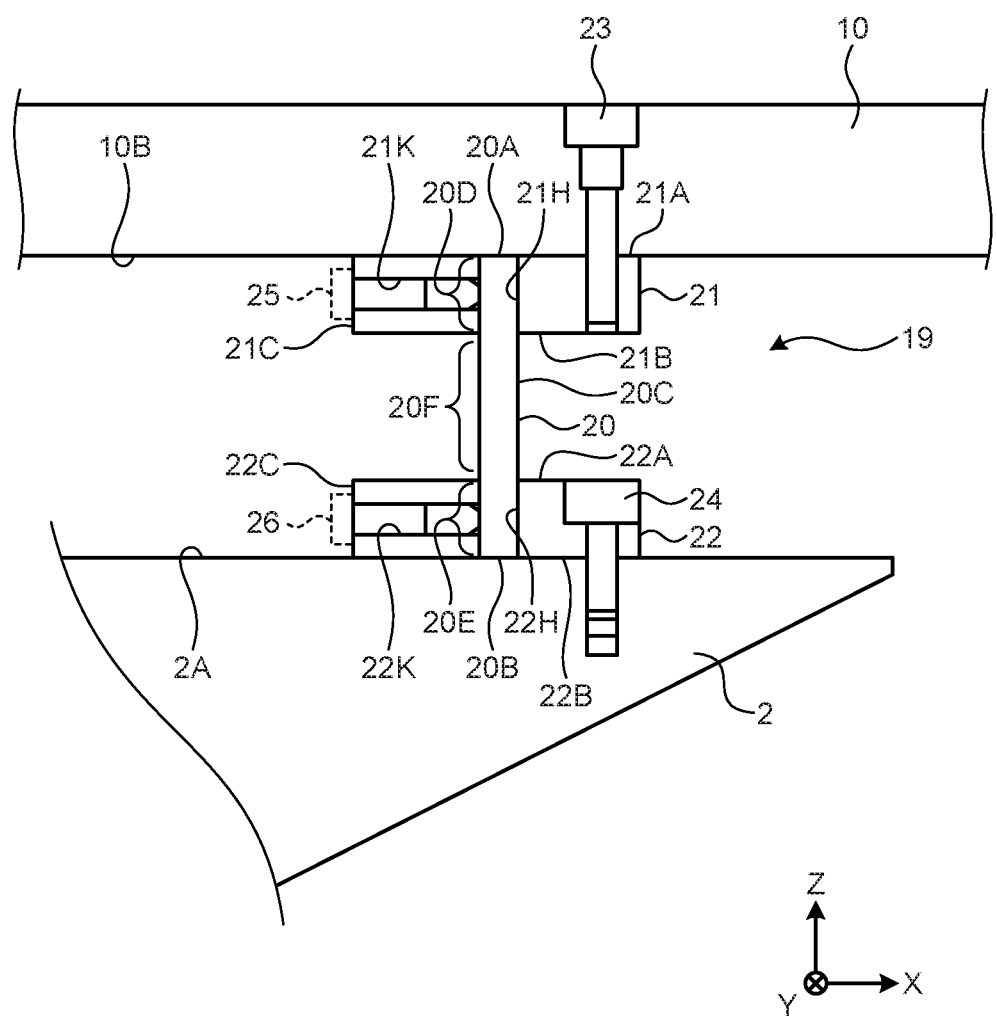
FIG. 10 is a diagram illustrating an example of a support device according to the present embodiment.

Next, the support device 19 will be described. FIG. 10 is an enlarged view illustrating an example of the support device 19 according to the present embodiment. The support device 19 flexibly supports the table 10. As illustrated in FIGS. 1, 3, 4, 10, and other figures, at least a part of the support device 19 is arranged between the second member 2 and the table 10. The second member 2 supports the table 10 through the support device 19.

The support device 19 includes a pin 20. The pin 20 is a flexible pin. The pin 20 is slightly deformable. The pin 20 has flexibility, and is elastically deformable. Deformation of the pin 20 includes one or both of bending deformation and torsional deformation.

In the present embodiment, the pin 20 is a parallel pin. In the description below, the pin 20 is appropriately referred to as parallel pin 20. The parallel pin 20 is arranged to become parallel to the Z axis. The parallel pin 20 is arranged such that an axis of the parallel pin 20 becomes parallel to the Z axis between the second member 2 and the table 10. The parallel pin 20 is a rod-like member long in the Z axis direction. An external shape of a cross section of the parallel pin 20 parallel to the XY plane is a circle. That is, the parallel pin 20 is a columnar member long in the Z axis direction. A diameter of the parallel pin 20 is constant. The parallel pin 20 is thinner than the third member 3. In other words, the external shape of the parallel pin 20 in the XY plane is smaller than the external shape of the third member 3.

The parallel pin 20 connects the second member 2 and the table 10. As illustrated in FIG. 10, the parallel pin 20 includes an upper surface 20A facing the +Z direction, a lower surface 20B facing the −Z direction, and a side surface (outer surface) 20C that connects the upper surface 20A and the lower surface 20B. In the present embodiment, the parallel pin 20 is connected to a central portion of the lower surface 10B of the table 10. The parallel pin 20 is connected to a central portion of the upper surface 2A of the second member 2. The parallel pin 20 is arranged such that the upper surface 20A of the parallel pin 20 and the lower surface 10B of the table 10 are in contact with each other. The parallel pin 20 is arranged such that the lower surface 20B of the parallel pin 20 and the upper surface 2A of the second member 2 are in contact with each other. The parallel pin 20 and the table 10 may be connected such that the upper surface 20A of the parallel pin 20 and a center of the lower surface 10B of the table 10 are in contact with each other. The parallel pin 20 and the second member 2 may be connected such that the lower surface 20B of the parallel pin 20 and a center of the upper surface 2A of the second member 2 are in contact with each other.

The support device 19 includes a support member 21 that supports an upper portion 20D of the parallel pin 20, and a support member 22 that supports a lower portion 20E of the parallel pin 20. The upper portion 20D of the parallel pin 20 includes the upper end portion (upper surface 20A) of the parallel pin 20. The lower portion 20E of the parallel pin 20 includes the lower end portion (lower surface 20B) of the parallel pin 20.

The support member 21 includes an upper surface 21A that can face the lower surface 10B of the table 10, a lower surface 21B facing an opposite direction to the upper surface 21A, and a hole (through hole) 21H formed to connect the upper surface 21A and the lower surface 21B. The support member 21 is fixed to the table 10 with a fixing member 23 like a bolt. The support member 21 is fixed to the table 10 in a state where the upper surface 21A and the lower surface 10B of the table 10 are in contact with each other.

The support member 22 includes a lower surface 22B that can face the upper surface 2A of the second member 2, an upper surface 22A facing an opposite direction to the lower surface 22B, and a hole (through hole) 22H formed to connect the upper surface 22A and the lower surface 22B. The support member 22 is fixed to the second member 2 with a fixing member 24 like a bolt. The support member 22 is fixed to the second member 2 in a state where the lower surface 22B and the upper surface 2A of the second member 2 are in contact with each other.

The upper portion 20D of the parallel pin 20 is arranged in the hole 21H of the support member 21. The upper portion 20D of the parallel pin 20 is fitted into the hole 21H. Accordingly, the position of the upper portion 20D of the parallel pin 20 is fixed, and change of a relative position between the support member 21 and the upper portion 20D of the parallel pin 20 is suppressed. The upper portion 20D of the parallel pin 20 is fixed to the table 10 with the support member 21, and change of a relative position between the upper portion 20D of the parallel pin 20 and the table 10 is suppressed. In the present embodiment, the support member 21 includes a hole 21K that connects the side surface (outer surface) 21C of the support member 21 and an inner surface of the hole 21H. A fixing member 25 like a bolt can be arranged in the hole 21K. For example, the fixing member 25 may be screwed into the hole 21K provided with a screw groove such that a tip end portion of the fixing member 25 pushes the side surface 20C of the upper portion 20D of the parallel pin 20 arranged in the hole 21H. The upper portion 20D of the parallel pin 20 is sandwiched between the tip end portion of the fixing member 25 and the inner surface of the hole 21H, so that change of the relative position between the support member 21 and the upper portion 20D of the parallel pin 20 can be more reliably suppressed.

The lower portion 20E of the parallel pin 20 is arranged in the hole 22H of the support member 22. The lower portion 20E of the parallel pin 20 is fitted into the hole 22H. Accordingly, the position of the lower portion 20E of the parallel pin 20 is fixed, and change of a relative position between the support member 22 and the lower portion 20E of the parallel pin 20 is suppressed. The lower portion 20E of the parallel pin 20 is fixed to the second member 2 with the support member 22, and change of a relative position between the lower portion 20E of the parallel pin 20 and the second member 2 is suppressed. In the present embodiment, the support member 22 includes a hole 22K that connects a side surface (outer surface) 22C of the support member 22 and an inner surface of the hole 22H. A fixing member 26 like a bolt can be arranged in the hole 22K. For example, the fixing member 26 may be screwed into the hole 22K provided with a screw groove such that a tip end portion of the fixing member 26 pushes the side surface 20C of the lower portion 20E of the parallel pin 20 arranged in the hole 22H. The lower portion 20E of the parallel pin 20 is sandwiched between the tip end portion of the fixing member 26 and the inner surface of the hole 22H, so that change of the relative position between the support member 22 and the lower portion 20E of the parallel pin 20 is more reliably suppressed.

In the present embodiment, a middle portion 20F of the parallel pin 20 between the upper portion 20D and the lower portion 20E is arranged outside the hole 21H of the support member 21 and the hole 22H of the support member 22. The support members 21 and 22 are not arranged around the middle portion 20F. That is, no members are arranged around the middle portion 20F, and the side surface 20C of the middle portion 20F is not in contact with members.

The parallel pin 20 is arranged to receive a load relative to the Z axis direction. In the present embodiment, relative movement between the table 10 and the second member 2 relative to the Z axis direction is suppressed (restricted) by the support device 19 including the parallel pin 20.

At least a part of the parallel pin 20 can bend. At least a part of the parallel pin 20 is deformable (elastically deformable). That is, at least a part of the parallel pin 20 has flexibility, and is elastically deformable. In the present embodiment, the middle portion 20F of the parallel pin 20 can bend, and is elastically deformable. The deformation (elastic deformation) of the middle portion 20F includes one or both of bending deformation and torsional deformation. The middle portion 20F is deformable to change a relative position between the upper portion 20D and the lower portion 20E in the XY plane. For example, the middle portion 20F is deformable (bending-deformable, deflection-deformable) to change a relative position between the upper portion 20D and the lower portion 20E relative to one or both of the X axis direction and the Y axis direction. The middle portion 20F is deformable (torsionally deformable) to change a relative position between the upper portion 20D and the lower portion 20E relative to the θZ direction. Further, the middle portion 20F is deformable (bending-deformable, deflection-deformable) to change a relative position between the upper portion 20D and the lower portion 20E in one or both of the θX direction and the θY direction. That is, by the deformation of the middle portion 20F, the relative position between the upper portion 20D and the lower portion 20E relative to the directions (the X axis, Y axis, θX, θY, and θZ directions) except the Z axis direction is changed. The upper portion 20D is fixed to the table 10 through the support member 21. The lower portion 20E is fixed to the second member 2 through the support member 22. Therefore, by the deformation of the middle portion 20F, the relative position between the table 10 and the second member 2 relative to the directions (the X axis, Y axis, θX, θY, and θZ directions) except the Z axis direction. That is, the table 10 and the second member 2 are relatively movable by the support device 19 including the parallel pin 20. The relative movement between the table 10 and the second member 2 relative to the directions (the X axis, Y axis, θX, θY, and θZ directions) except the Z axis direction is allowed by the support device 19 including the parallel pin 20.

In the present embodiment, the parallel pin 20 (support device 19) is connected to the central portion of the lower surface 10B of the table 10. The plurality of (four) third members 3 is arranged to surround the parallel pin 20. Each of the plurality of third members 3 is connected to a peripheral edge portion of the lower surface 10B of the table 10.

In the present embodiment, at least a part of the suppression member 13 (guide device 14) is in contact with the second member 2. Therefore, the second member 2 may vibrate or may be moved off the target trajectory due to the relative movement of the suppression member 13 and the second member 2. In the present embodiment, the table 10 is supported by the second member 2 through the support device 19. Therefore, even if the second member 2 vibrates or is moved off the target trajectory due to the contact between the suppression member 13 (guide device 14) and the second member 2, the undesired movement (vibration) is absorbed by the relative movement of the table 10 (the upper portion 20D and the support member 21) and the second member 2 (lower portion 20E and the support member 22). Accordingly, the movement of the table 10 off the target trajectory and the transmission of the vibration of the second member 2 to the table 10 are suppressed.

Next, an example of an operation of the table device 100 will be described. The power of the actuator 7 is transmitted to the first member 1 through the power transmission device 11 by the operation of the actuator 7. The first member 1 is moved in the X axis direction by the operation of the actuator 7. The first member 1 is guided by the guide device 9 and moved in the X axis direction. The first member 1 is moved in the X axis direction in a target trajectory (desired trajectory) by the guide device 9. In the present embodiment, the first member 1 is movable straight in the X axis direction by the guide device 9.

The second member 2 is moved in the Z axis direction by the movement of the first member 1 relative to the X axis direction. The second member 2 is guided by the guide device 4 and moved in the Z axis direction. Further, the second member 2 is moved in the Z axis direction while the movement relative to the X axis direction is suppressed by the suppression member 13. Further, the second member 2 is guided by the guide device 14 and moved in the Z axis direction. By the movement of the second member 2 in the Z axis direction, the table 10 supported by the second member 2 is also moved in the Z axis direction together with the second member 2.

In the present embodiment, the gas bearing 5G is formed between the third member 3 connected to the table 10 and the bearing member 5 that movably supports the third member 3. The gas bearing 5G suppresses the movement of the third member 3 in the X axis direction and the Y axis direction, and allows the movement of the third member 3 in the Z axis direction. Further, the bearing member 5 supports the third member 3 with the gas bearing 5G in a non-contact manner. That is, the bearing member 5 that forms the gas bearing 5G between the bearing member 5 and the third member 3 suppresses the movement of the third member 3 in the X axis direction and the Y axis direction, and movably supports the third member 3 in the Z axis direction in a non-contact manner. The bearing member 5 guides the third member 3 in the Z axis direction in a non-contact manner. Accordingly, the third member 3 and the table 10 connected to the third member 3 are moved in the Z axis direction in a target trajectory (desired trajectory). In the present embodiment, the third member 3 and the table 10 connected to the third member 3 are movable straight in the Z axis direction with the bearing member 5 that can form the gas bearing 5G between the bearing member 5 and the third member 3.

The actuator 7 is operated to arrange the object S supported by the table 10 in the target position. In the present embodiment, since the bearing member 5 that can form the gas bearing 5G that guides the third member 3 in the Z axis direction in a non-contact manner is provided, the table 10 can be moved in the target trajectory (desired trajectory). Therefore, the table device 100 can arrange the object S in the target position.

In the present embodiment, the suppression member 13 is provided. Therefore, even if the first member 1 is moved in the X axis direction, the movement of the second member 2 in the X axis direction is suppressed. Accordingly, the movement of the first member 1 relative to the X axis direction is efficiently converted into the movement of the second member 2 relative to the Z axis direction. Meanwhile, there is a possibility that the second member 2 performs undesired movement (vibration) due to the contact between the suppression member 13 (guide device 14) and the second member 2. In the present embodiment, the table 10 is flexibly supported by the support device 19 including the parallel pin 20. The relative movement between the table 10 and the second member 2 relative to the directions (the X axis, Y axis, θX, θY, and θZ directions) except the Z axis direction is allowed by the support device 19 including the parallel pin 20. Therefore, even if the second member 2 performs undesired movement (vibration), transmission of the undesired movement (vibration) to the table 10 is suppressed by the support device 19.

In the present embodiment, when the table 10 is moved in the +Z direction, using the power of the actuator 7, or when the position of the table 10 relative to the Z axis direction is maintained using the power of the actuator 7, a load may be applied to the actuator 7. That is, the actuator 7 needs to continuously generate predetermined power (torque) in order to raise the table 10 or to maintain the position of the table 10. In this case, the predetermined electric power (current) needs to be continuously supplied to the actuator 7, and as a result, the actuator 7 may generate heat. When the actuator 7 generates heat, the surrounding members may be thermally deformed. As a result, the performance of the table device 100 may be decreased, such as the decrease in the positioning accuracy of the table 10 and the movement of the table 10 off the target trajectory. Further, the object S supported by the table 10 may be thermally deformed by the generation of heat of the actuator 7.

In the present embodiment, the gravity compensation device 60 is provided. Therefore, when the table 10 is moved in the +Z direction, or when the position of the table 10 relative to the Z axis direction is maintained, the power (torque) generated by the actuator 7 can be small. That is, the electric power (current) supplied to the actuator 7 can be small. Therefore, the generation of heat of the actuator 7 is suppressed. As a result, thermal deformation of peripheral members and thermal deformation of the object S are suppressed.

Further, since the gravity compensation device 60 is provided, even if the mass (weight) of the object S mounted on the table 10 is large, the load applied to the actuator 7 is decreased. Further, since the gravity compensation device 60 is provided, the power generated by the actuator 7 can be small. Therefore, downsizing of the actuator 7 can be achieved.

Further, since the pressure in the space 63 is increased by the gravity compensation device 60, even if abnormality (emergency stop) such as power failure occurs and the actuator 7 stops generating the power, sudden descent (drop) of the table 10 is suppressed. For example, since an electromagnetic brake for prevention of the drop of the table 10 can be omitted, there is no generation of heat (no thermal deformation) due to the electromagnetic brake.

As described above, according to the present embodiment, the bearing member 5 is provided, which forms the gas bearing 5G between the bearing member 5 and the third member 3, and movably supports (guides) the third member 3 in the Z axis direction. Therefore, the table 10 to which the third member 3 is connected can be moved in the target trajectory (desired trajectory). In the present embodiment, the bearing member 5 supports (guides) the third member 3 such that the third member 3 is moved straight in the Z axis direction. Accordingly, the table 10 to which the third member 3 is connected is movable straight in the Z axis direction. That is, a decrease in straightness in the movement of the third member 3 and the table 10 is suppressed by the bearing member 5 that can form the gas bearing 5G. Accordingly, the object S supported by the table 10 is arranged in the target position.

In the present embodiment, the gas bearing 5G is formed between the third member 3 and the bearing member 5, and the bearing member 5 supports the third member 3 in a non-contact manner. Accordingly, the third member 3 is smoothly movable in the Z axis direction. When the bearing member 5 comes in contact with the third member 3, resisting power may occur against the movement of the third member 3. As a result, the table 10 and the third member 3 may not be moved straight although the table 10 and the third member 3 are intended to be moved straight. Further, when the bearing member 5 comes in contact with the third member 3, vibration may occur due to the movement of the third member 3. When the vibration occurs in the third member 3, the table 10 vibrates, and as a result, the positioning accuracy of the table 10 may be decreased. In the present embodiment, the bearing member 5 movably supports the third member 3 in a non-contact manner. Therefore, the table 10 and the third member 3 can be moved straight. Further, occurrence of the vibration is suppressed. As a result, the decrease in the positioning accuracy of the table 10 is suppressed, and the table 10 and the object S supported by the table 10 can be arranged in the target position.

Further, in the present embodiment, the table device 100 includes the wedge-shaped lifting device that moves the table 10 by the relative movement of the first member 1 and the second member 2. Therefore, a ratio (reduction ratio or resolving power) of a moving amount of the first member 1 relative to the X axis direction and a moving amount of the second member 2 relative to the Z axis direction can be adjusted by adjustment of the angle θ.

Further, in the present embodiment, the table 10 is flexibly supported by the second member 2 through the support device 19. Therefore, for example, even if the second member 2 performs undesired movement (vibration) due to the contact of the suppression member 13 (guide device 14)

and the second member 2, transmission of the undesired movement (vibration) to the table 10 is suppressed by the support device 19.

Further, in the present embodiment, the support device 19 includes the parallel pin 20, and the second member 2 and the table 10 are connected through the parallel pin 20. Accordingly, the relative position between the support member 21 (table 10) and the parallel pin 20 (support device 19) and the relative position between the support member 22 (second member 2) and the parallel pin 20 (support device 19) are secured, and rattling between the support member 21 (table 10) and the parallel pin 20 (support device 19) or rattling between the support member 22 (second member 2) and the parallel pin 20 (support device 19) are suppressed.

Further, in the present embodiment, in the moving range of the third member 3 relative to the Z axis direction, the supply port 15 continuously face the side surface 3C of the third member 3. Accordingly, in the moving range of the third member 3, the gas bearing 5G can be continuously formed between the third member 3 and the bearing member 5, and the non-contact state between the third member 3 and the bearing member 5 can be maintained.

Further, in the present embodiment, the dimension of the third member 3 is larger than the dimension of the bearing member 5 relative to the Z axis direction. Accordingly, the third member 3 protruding from the upper end portion of the bearing member 5 can be smoothly connected to the table 10. Further, the third member 3 protrudes from the lower end portion of the bearing member 5. Therefore, balance of the mass (weight) between the upper end portion side and the lower end portion side of the bearing member 5 is improved. Accordingly, the third member 3 can be moved straight.

Further, in the present embodiment, in the moving range of the third member 3, the center G3 of the third member 3 is continuously arranged between the upper end portion (one end portion) and the lower end portion (the other end portion) of the bearing member 5. Accordingly, even during the movement of the third member 3, the balance of the mass (weight) between the upper end portion side and the lower end portion side of the bearing member 5 is improved. Therefore, the third member 3 can be moved straight.

Further, in the present embodiment, the external shape of the cross section of the third member 3 is a circle. The bearing member 5 is a cylindrical member arranged around the side surface 3C of the third member 3. There is a possibility that higher machining accuracy can be more easily obtained in machining of the third member 3 with the circular external shape in the cross section than machining of the third member with a square shape. In other words, there is a high possibility that a target shape can be more easily obtained in a case of manufacturing the third member 3 with the circular external shape than a case of manufacturing the third member 3 with the square external shape. Further, there is a high possibility that high machining accuracy (target shape) can be more easily obtained in a case of manufacturing the bearing member 5 with the circular inner surface 5C in the cross section than a case of manufacturing a bearing member with a square inner shape in the cross section. For example, when manufacturing the square third member and bearing member, it may be difficult to manufacture the third member and the bearing member such that the dimension of a gap formed between a corner portion of the third member and the bearing member and the dimension of a gap formed between a plane portion of the third member and the bearing member become equal. According to the present embodiment, unevenness of the dimension of the gap formed between the side surface 3C of the third member 3 and the inner surface 5C of the bearing member 5 is suppressed by use of the circular third member 3 and bearing member 5. Therefore, unevenness of the pressure is suppressed in the gap formed between the side surface 3C of the third member 3 and the inner surface 5C of the bearing member 5. Therefore, the decrease in the performance of the gas bearing 5G is suppressed, and the movement of the third member 3 off the target trajectory is suppressed.

Further, in the present embodiment, at least two third members 3 are arranged, and are respectively connected to the different portions of the table 10. Therefore, for example, rotation of the table 10 is suppressed by the plurality of third members 3 connected to the table. Accordingly, the positioning accuracy of the table 10 is improved. That is, in the present embodiment, the external shape of the cross section of the third member 3 is a circle, and the bearing member 5 is a cylindrical member arranged around the side surface 3C of the third member 3. Therefore, the third member 3 may be moved (rotated) in the θZ direction inside the bearing member 5. When the third member 3 connected to the table 10 is one, the table 10 may also be rotated due to the rotation of the third member 3 with respect to the bearing member 5. The plurality of third members 3 is arranged in the present embodiment. Therefore, the plurality of third members 3 is supported by the bearing members 5 and the support members 6, so that the movement (rotation) of the table 10 relative to the θZ direction is suppressed.

Further, in the present embodiment, since the suppression member 13 is provided, even if the first member 1 is moved in the X axis direction, the movement of the second member 2 in the X axis direction is suppressed. Accordingly, the movement of the first member 1 relative to the X axis direction is efficiently converted into the movement of the second member 2 relative to the Z axis direction.

Further, in the present embodiment, the gravity compensation device 60 is provided. Therefore, the load applied to the actuator 7 is decreased. Therefore, the generation of heat of the actuator 7 is suppressed, and the thermal deformation of the members around the actuator 7 is suppressed in the table device 100. The members around the actuator 7 includes at least one of the members of the guide device 4, the members of the guide device 9, the members of the guide device 14, the first member 1, the second member 2, the third member 3, the support member 6, and the table 10. Therefore, the decrease in the positioning accuracy of the table 10 and the movement of the table 10 off the target trajectory are suppressed. As a result, the decrease in the performance of the table device 100 is suppressed.

In the present embodiment, the upper portion 20D of the parallel pin 20 is fixed to the support member 21 fixed to the table 10, and the lower portion 20E of the parallel pin 20 is fixed to the support member 22 fixed to the second member 2. For example, a hole in which the upper portion 20D of the parallel pin 20 can be arranged may be provided in the lower surface 10B of the table 10, and the upper portion 20D of the parallel pin 20 may be fitted into the hole. A hole in which the lower portion 20E of the parallel pin 20 can be arranged may be provided in the upper surface 2A of the second member 2, and the lower portion 20E of the parallel pin 20 may be fitted into the hole. In doing so, the upper portion 20D of the parallel pin 20 is fixed to the table 10, and the lower portion 20E of the parallel pin 20 is fixed to the second member 2. Accordingly, the relative position between the table 10 and the parallel pin 20 (support device 19) and the relative position between the second member 2 and the parallel pin 20 (support device 19) are secured, and rattling between the table 10 and the parallel pin 20 (support device 19) or rattling between the second member 2 and the parallel pin 20 (support device 19) is suppressed.

In the present embodiment, the pin 20 that connects the table 10 and the second member 2 may be a parallel pin, a tapered pin, a front-split tapered pin with a split in a tip, a spring pin obtained by winding a thin plate in a cylindrical manner, and using a spring action in a radial direction, or a split pin. These pins 20 have flexibility. The pin 20 is arranged to make the axis of the pin 20 parallel to the Z axis, the upper portion of the pin 20 is fixed to the table 10 (support member 21), and the lower portion of the pin 20 is fixed to the second member 2 (support member 22). Accordingly, the second member 2 can flexibly support the table 10 through the support device 19.

In the present embodiment, a so-called porous throttle type has been exemplarily described, in which the bearing member 5 includes the porous body, and the gas bearing 5G is formed with the gas supplied through the porous body hole. The throttle type of the bearing member 5 for forming the gas bearing 5G is not limited to the porous throttle type. For example, the throttle type may be a self-throttle type without using the porous body, may be an orifice throttle type, or may be a surface-throttle type that supplies a gas through a groove provided in a bearing surface (guide surface). For example, in a case of the bearing member 5 of the orifice throttle type, the supply port 15 that supplies the gas includes an opening of an orifice.

Figure 11:
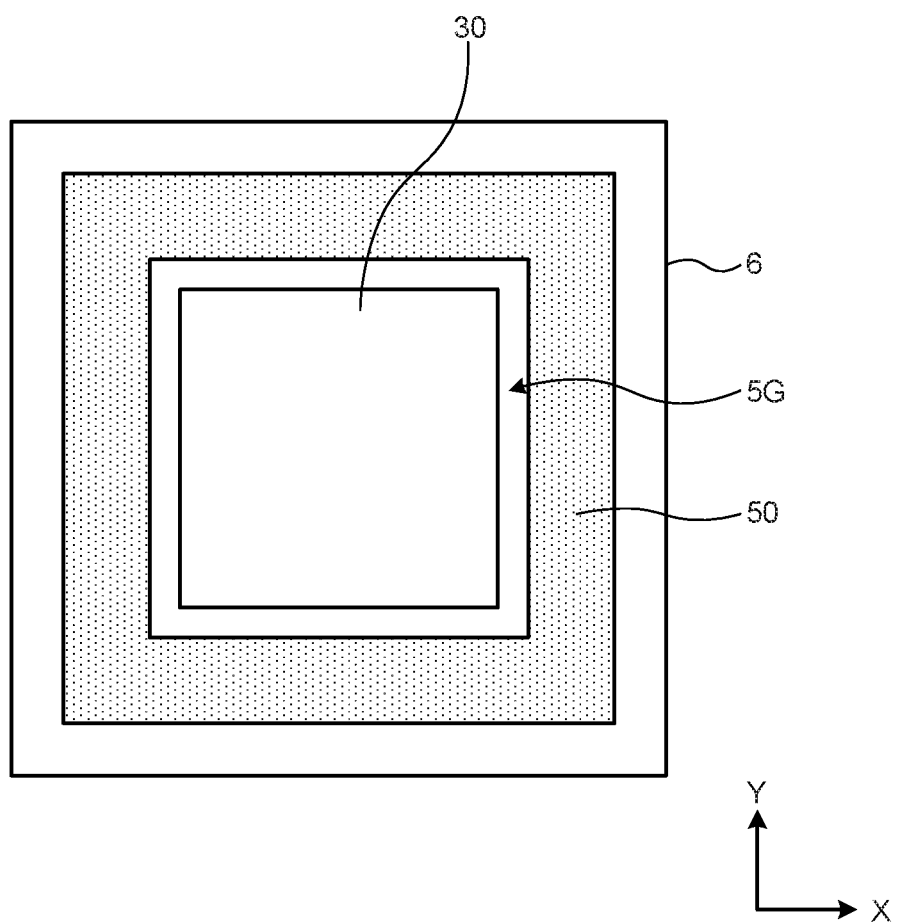
FIG. 11 is a sectional view illustrating an example of a gas bearing according to the present embodiment.

In the present embodiment, the external shape of the third member 3 with a cross section parallel to the XY plane has been a circle. As illustrated in FIG. 11, the external shape of a third member 30 with a cross section parallel to the XY plane may be a polygon. In the example illustrated in FIG. 11, the external shape of the cross section of the third member 30 is a quadrangle. Note that the external shape of the cross section of the third member 30 is not limited to the quadrangle, and may be other polygons. A bearing member 50 may be determined based on the shape of the cross section of the third member 30 such that a certain gap is formed between the bearing member 50 and the side surface of the third member 30. In the example illustrated in FIG. 11, movement (rotation) of the third member 30 in the θZ direction inside the bearing member 50 is suppressed. One third member 30 may be connected to the table 10, or two or more third members 30 may be connected to the table 10.

Figure 12:
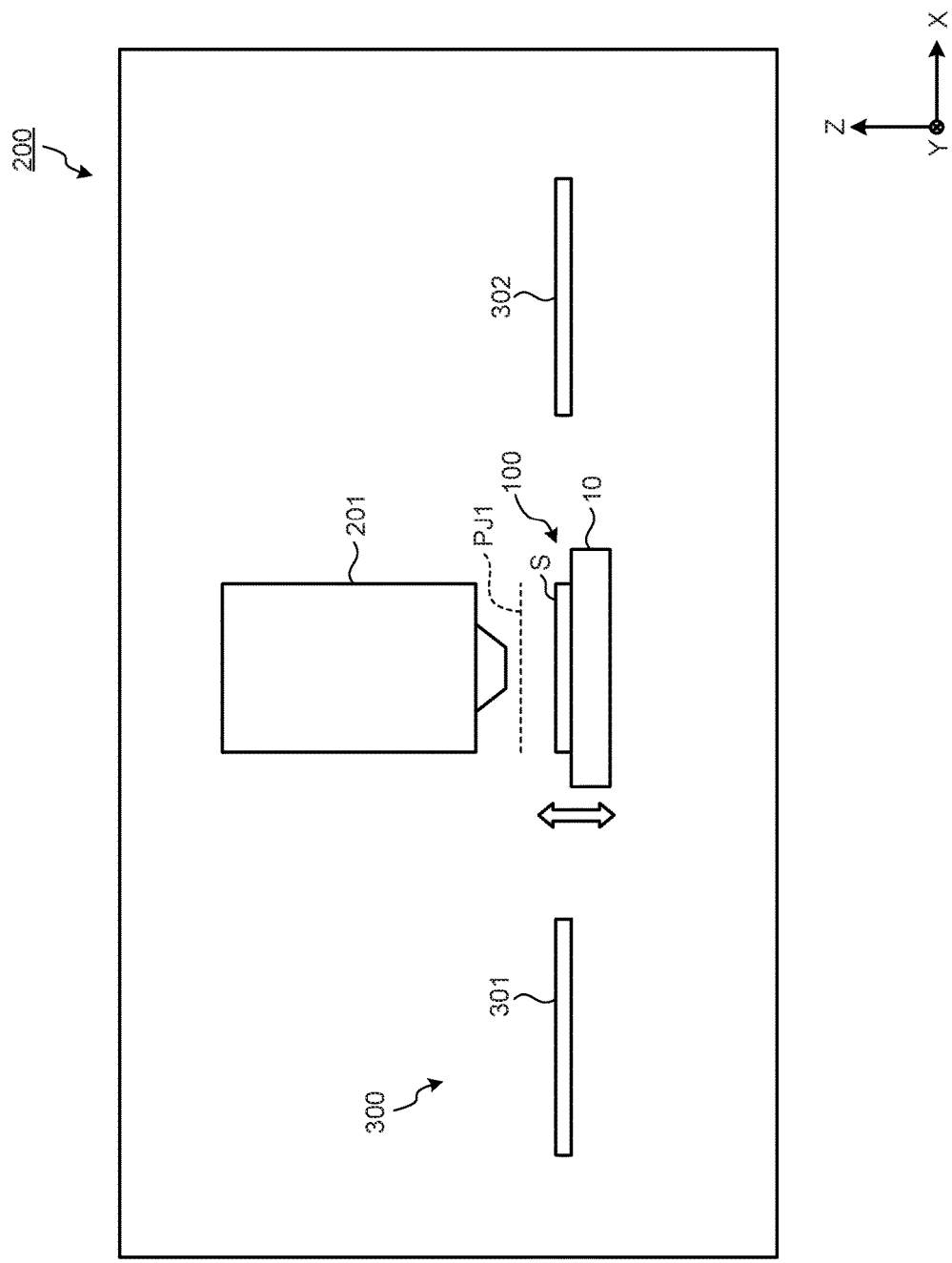
FIG. 12 is a diagram illustrating an example of a conveyance device and a semiconductor manufacturing device according to the present embodiment.

FIG. 12 is a diagram illustrating an example of a semiconductor manufacturing device 200 provided with the table device 100 according to the present embodiment. The semiconductor manufacturing device 200 includes a semiconductor device manufacturing device that can manufacture a semiconductor device. The semiconductor manufacturing device 200 is used in at least a part of a process of manufacturing a semiconductor device. The semiconductor manufacturing device 200 includes a conveyance device 300 that can convey the object S for manufacturing the semiconductor device. The conveyance device 300 includes the table device 100 according to the present embodiment. Note that the table device 100 is simplified and illustrated in FIG. 12.

In the present embodiment, the object S is a substrate for manufacturing the semiconductor device. The semiconductor device is manufactured from the object S. The object S may include a semiconductor wafer or a glass plate. The semiconductor device is manufactured by formation of a device pattern (wiring pattern) on the object S.

The semiconductor manufacturing device 200 performs processing for forming the device pattern on the object S arranged in a processing position PJ1. The table device 100 arranges the object S supported by the table 10 in the processing position PJ1. The conveyance device 300 includes a carry-in device 301 that can convey (carry in) the object S to the table 10 of the table device 100, and a carry-out device 302 that can convey (carry out) the object S from the table 10. The object S before processing is conveyed (carried in) to the table 10 by the carry-in device 301. The object S supported by the table 10 is conveyed to the processing position PJ1 by the table device 100. The object S after processing is conveyed (carried out) from the table 10 by the carry-out device 302.

The table device 100 moves the table 10 to move the object S supported by the table 10 to the processing position PJ1. As described in the above embodiment, the table 10 is connected with the third member 3. The third member 3 is guided by the bearing member 5 in a non-contact manner. Therefore, the table device 100 can move the table 10 in a target trajectory, and can arrange the object S supported by the table 10 in the processing position (target position) PJ1.

For example, when the semiconductor manufacturing device 200 includes an exposure device that projects an image of the device pattern to the object S through a projection optical system 201, the processing position PJ1 includes a position (exposure position) of an image plane of the projection optical system 201. By arrangement of the object S in the processing position PJ1, the semiconductor manufacturing device 200 can project the image of the device pattern to the object S through the projection optical system 201.

After the object S is processed in the processing position PJ1, the object S after processing is conveyed from the table 10 by the carry-out device 302. The object S conveyed (carried out) by the carry-out device 302 is conveyed to a processing device that performs a post-process.

In the present embodiment, the table device 100 can arrange the object S in the processing position (target position) PJ1. Therefore, manufacturing of a defective product is suppressed. That is, a decrease in positioning accuracy of the object S in the semiconductor manufacturing device 200 is suppressed by the table device 100. Therefore, generation of the defective product is suppressed.

Further, in the present embodiment, the load applied to the actuator 7 of the table device 100 is decreased by the gravity compensation device 60, and generation of heat of the actuator 7 is suppressed.

Therefore, thermal deformation of the object S is suppressed. Further, thermal deformation of members around the actuator 7 is suppressed. The members around the actuator 7 include the members of the table device 100. Therefore, the decrease in the positioning accuracy of the table 10, and movement of the table 10 deviating from the target trajectory are suppressed. Therefore, the table device 100 can arrange the object S in the processing position (target position) PJ1. The members around the actuator 7 include not only the members of the table device 100, but also members of the conveyance device 300 (the carry-in device 301 and the carry-out device 302). Suppression of the thermal deformation of the conveyance device 300 suppresses the decrease in the performance of the conveyance device 300. Therefore, the conveyance device 300 can convey the object S to the target position. The members around the actuator 7 include members of the semiconductor manufacturing device 200. For example, suppression of thermal deformation of the projection optical system 201 suppresses the decrease in the performance of the semiconductor manufacturing device 200. Further, suppression of the generation of heat of the actuator 7 suppresses change of a proceeding direction of the light emitted from the projection optical system 201, and change of a refractive index in a space that the light passes through.

When the semiconductor manufacturing device 200 includes a measuring device that measures the device pattern of the object S through an optical system, the processing position PJ1 includes a position (measuring position) of a focal point of the optical system. By arrangement of the object S in the processing position PJ1, the semiconductor manufacturing device 200 can acquire an image of the device pattern formed on the object S through the optical system. When the semiconductor manufacturing device 200 includes a film forming device that forms a film on the object S, the processing position PJ1 is a position where a material for forming the film can be supplied. By arrangement of the object S in the processing position PJ1, the film for forming the device pattern is formed on the object S.

Note that a flat panel display manufacturing device may include the table device 100 according to the present embodiment, or may include the conveyance device 300 including the table device 100. The flat panel display manufacturing device includes the exposure device, for example, and is used in at least a part of a process of manufacturing a flat panel display. When the flat panel display manufacturing device includes the exposure device, an image of a pattern for manufacturing the flat panel display is projected to the object S that includes a glass plate through the projection optical system. The flat panel display manufacturing device can process the object S arranged in a target position. Therefore, manufacturing of a defective product from the object S is suppressed. The flat panel display includes at least one of a liquid crystal display, a plasma display, and an organic EL display.

Figure 13:
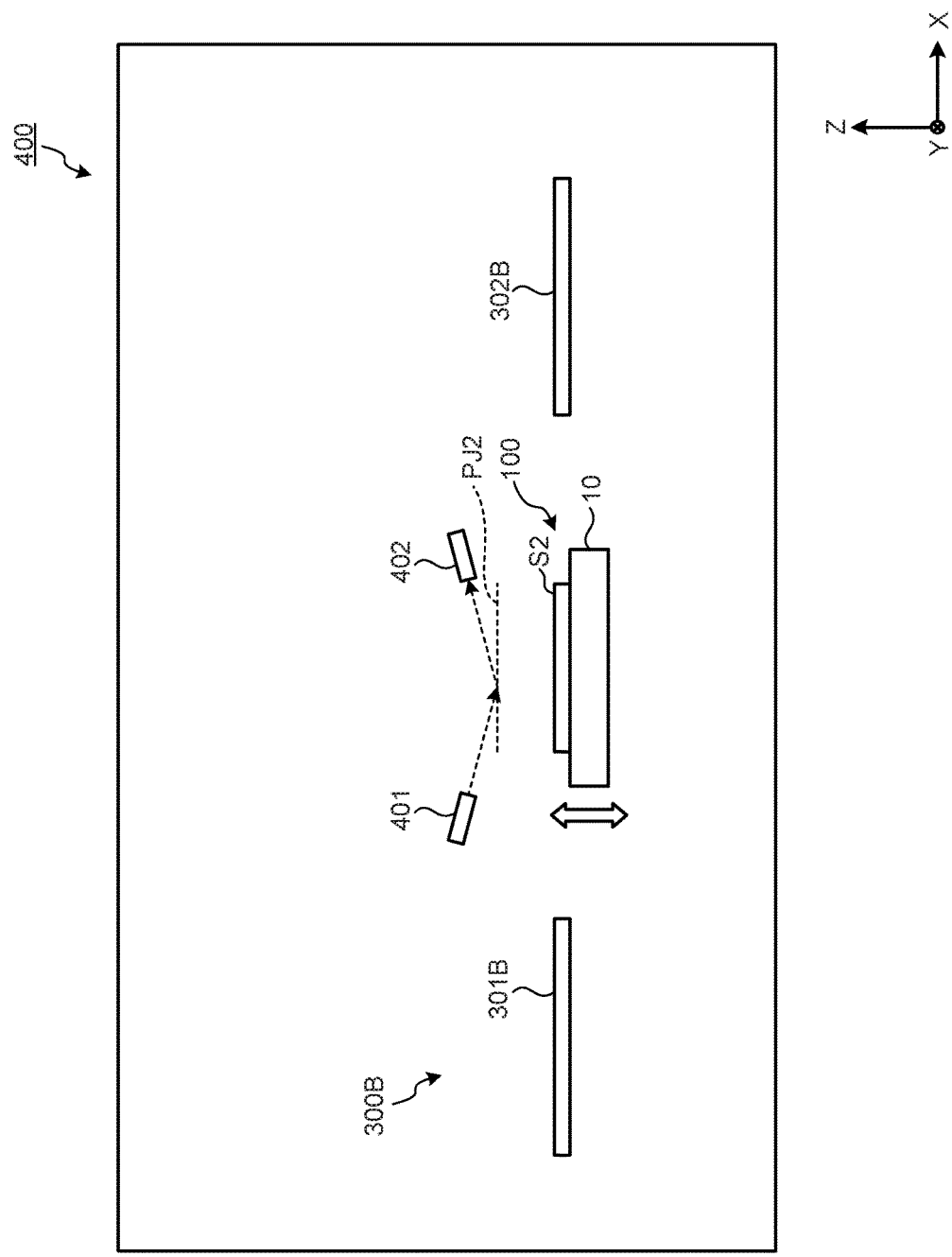
FIG. 13 is a diagram illustrating an example of the conveyance device and an inspection device according to the present embodiment.

FIG. 13 is a diagram illustrating an example of an inspection device 400 provided with the table device 100 according to the present embodiment. The inspection device 400 inspects an object (semiconductor device) S2 manufactured by the semiconductor manufacturing device 200. The inspection device 400 includes a conveyance device 300B that can convey the object S2. The conveyance device 300B includes the table device 100 according to the present embodiment. In FIG. 13, the table device 100 is simplified and illustrated.

The inspection device 400 inspects the object S2 arranged in an inspection position PJ2. The table device 100 arranges the object S2 supported by the table 10 in the inspection position PJ2. The conveyance device 300B includes a carry-in device 301B that can convey (carry in) the object S2 to the table 10 of the table device 100, and a carry-out device 302B that can convey (carry out) the object S2 from the table 10. The object S2 before inspection is conveyed to the table 10 by the carry-in device 301B. The object S2 supported by the table 10 is conveyed to the inspection position PJ2 by the table device 100. The object S2 after inspection is conveyed (carried out) from the table 10 by the carry-out device 302B.

The table device 100 moves the table 10 to move the object S2 supported by the table 10 to the inspection position PJ2. As described in the above embodiment, the table 10 is connected with the third member 3. The third member 3 is guided by the bearing member 5 in a non-contact manner. Therefore, the table device 100 can move the table 10 in the target trajectory, and can arrange the object S2 supported by the table 10 in the inspection position (target position) PJ2.

In the present embodiment, the inspection device 400 optically inspects the object S2, using inspection light. The inspection device 400 includes an irradiation device 401 that can emit the inspection light, and a light-receiving device 402 that can receive at least a part of the inspection light emitted from the irradiation device 401 and reflected at the object S2. In the present embodiment, the inspection position PJ2 includes an irradiation position of the inspection light. By arrangement of the object S2 in the inspection position PJ2, the state of the object S2 is optically inspected.

After the inspection of the object S2 is performed in the inspection position PJ2, the object S2 after inspection is conveyed from the table 10 by the carry-out device 302B.

In the present embodiment, the table device 100 can suppress occurrence of inspection failure because the table device 100 can arrange the object S2 in the inspection position (target position) PJ2. That is, the inspection device 400 can favorably determine whether the object S2 is defective. Accordingly, conveyance of the defective object S2 to the post-process and shipment of the defective object S2 are suppressed.

Further, in the present embodiment, the load applied to the actuator 7 of the table device 100 is decreased by the gravity compensation device 60, and the generation of heat of the actuator 7 is suppressed, accordingly. Therefore, the thermal deformation of the object S2 is suppressed. Further, the thermal deformation of the members around the actuator 7 is suppressed. The members around the actuator 7 include members of the table device 100. Therefore, the decrease in the positioning accuracy of the table 10 and the movement of the table 10 deviating from the target trajectory are suppressed. Therefore, the table device 100 can arrange the object S2 in the inspection position (target position) PJ2. Accordingly, occurrence of inspection failure is suppressed. The members around the actuator 7 include not only the members of the table device 100, but also members of the conveyance device 300B (the carry-in device 301B and the carry-out device 302B). Suppression of the thermal deformation of the conveyance device 300B suppresses the decrease in the performance of the conveyance device 300B. Therefore, the conveyance device 300B can convey the object S2 to the target position. The members around the actuator 7 include members of the inspection device 400. For example, suppression of the thermal deformation of the irradiation device 401 and the light-receiving device 402 suppresses the decrease in the performance of the inspection device 400. Further, suppression of the generation of heat of the actuator 7 suppresses change of the proceeding direction of the inspection light emitted from the irradiation device 401 and change of the refractive index in the space that the inspection light passes through. Therefore, the inspection device 400 can suppress occurrence of the inspection failure.

Note that, in the present embodiment, the table 10 has been moved in the Z axis direction. In the present embodiment, the table 10 may be moved in a direction inclined with respect to the Z axis. The first member 1 may be moved in a direction inclined with respect to the XY plane, or the second member 2 may be moved in a direction inclined with respect to the Z axis. The third member 3 supported by the bearing member 5 in a non-contact manner can guide the table 10 in the inclined direction. The table 10 can be moved straight in the inclined direction by the third member 3 supported by the bearing member 5 in a non-contact manner.

Note that the suppression member 13 may be omitted in the above-described embodiment. The second member 2 is connected to the table 10, and the third member 3 is connected to the table 10. The gas bearing 5G suppresses the movement of the third member 3 relative to the X axis direction and the Y axis direction. Therefore, even if the suppression member 13 is omitted, movement of the second member 2 and the table 10 in the X axis direction is suppressed.

Note that, in the above-described embodiment, the gravity compensation device 60 may be omitted.

The invention claimed is:

1. A table device comprising:
a first member movable in a predetermined plane;
a second member relatively movable to the first member;
a first guide device, at least a part of the first guide device being arranged in the first member, and the first guide device guiding the second member such that the second member is moved in a first direction that is parallel to a first axis perpendicular to the predetermined plane by movement of the first member;
a table supported by the second member;
a third member connected to at least a part of the table;
a bearing member forming a gas bearing between the bearing member and the third member with a gas supplied between the bearing member and the third member, and movably supporting the third member in the first direction;
and
a support device including a pin that is arranged to extend in the first direction and that connects the second member and the table, the pin supporting the table,
wherein
the table is supported by the second member through the support device,
the first member is moved in a second direction that is parallel to a second axis in the predetermined plane,
the table device comprises a suppression member suppressing movement of the second member relative to the direction parallel to the second axis,
the table device further comprises a second guide device, at least a part of the second guide device being arranged in the suppression member, and
the second guide device guides the second member in the first direction.

2. The table device according to claim 1, wherein
the bearing member includes a first supply port supplying a gas between the bearing member and a side surface of the third member, and
the first supply port continuously faces the side surface of the third member in a moving range of the third member relative to the first direction.

3. The table device according to claim 1, wherein
a dimension of the third member is larger than a dimension of the bearing member relative to the first direction.

4. The table device according to claim 1, wherein
a center of the third member is continuously arranged between one end portion and the other end portion of the bearing member relative to the first direction in a moving range of the third member.

5. The table device according to claim 1, wherein
an external shape of a cross section of the third member parallel to the predetermined plane is a circle.

6. The table device according to claim 5, wherein
at least two third members are arranged, and are respectively connected to a first portion of the table and a second portion of the table, the second portion being different from the first portion.

7. The table device according to claim 1, wherein
the third member includes an upper surface and a lower surface, and at least a part of a side of the upper surface is connected to the table, and
the table device comprises:
an actuator generating power for moving the first member; and
a gravity compensation device including a second supply port arranged such that the second supply port faces a space that the lower surface of the third member faces and supplying a gas to the space.

8. The table device according to claim 7, comprising a support member, at least a part of the support member being arranged around the third member and the bearing member, and the support member supporting the bearing member, wherein
the second supply port supplies the gas to a space defined by the lower surface of the third member and an inner surface of the support member.

9. The table device according to claim 8, wherein
the gravity compensation device supplies the gas through the second supply port to make a pressure in the space that the lower surface faces higher than a pressure in a space outside the support member.

10. A conveyance device comprising the table device according to claim 1.

* * * * *